(12) United States Patent
Seong et al.

(10) Patent No.: US 9,318,704 B2
(45) Date of Patent: Apr. 19, 2016

(54) VARIABLE RESISTANCE MEMORY DEVICE AND METHODS OF FORMING THE SAME

(71) Applicants: Dongjun Seong, Seongnam-si (KR); Yoocheol Shin, Hwaseong-si (KR)

(72) Inventors: Dongjun Seong, Seongnam-si (KR); Yoocheol Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/717,575

(22) Filed: May 20, 2015

(65) Prior Publication Data

US 2015/0270483 A1 Sep. 24, 2015

Related U.S. Application Data

(63) Continuation of application No. 14/022,984, filed on Sep. 10, 2013, now Pat. No. 9,048,421.

(30) Foreign Application Priority Data

Sep. 14, 2012 (KR) ........................ 10-2012-0101872

(51) Int. Cl.
*H01L 45/00* (2006.01)
*H01L 21/62* (2006.01)
*H01L 27/24* (2006.01)

(52) U.S. Cl.
CPC .......... *H01L 45/1675* (2013.01); *H01L 27/249* (2013.01); *H01L 45/08* (2013.01); *H01L 45/12* (2013.01); *H01L 45/1226* (2013.01); *H01L 45/146* (2013.01); *H01L 45/1608* (2013.01); *H01L 45/1683* (2013.01); *H01L 27/2436* (2013.01)

(58) Field of Classification Search
CPC ... H01L 45/04; H01L 45/122; H01L 45/1233; H01L 45/1675; H01L 45/1683; H01L 27/2463; H01L 27/2472; H01L 27/2481; H01L 24/249; G11C 13/0002; G11C 13/0007
See application file for complete search history.

(56) References Cited

U.S. PATENT DOCUMENTS

| | | | |
|---|---|---|---|
| 8,525,247 B2 * | 9/2013 | Park | H01L 27/2409 257/314 |
| 8,872,256 B2 * | 10/2014 | Lee | H01L 27/1052 257/326 |
| 8,901,636 B2 * | 12/2014 | Jeong | H01L 27/0688 257/316 |
| 2010/0219392 A1 | 9/2010 | Awaya et al. | |
| 2011/0140068 A1 | 6/2011 | Ozawa et al. | |
| 2011/0199813 A1 | 8/2011 | Yoo et al. | |
| 2011/0210301 A1 | 9/2011 | Nansei | |
| 2011/0261607 A1 | 10/2011 | Tang et al. | |
| 2011/0284817 A1 | 11/2011 | Sasago et al. | |
| 2011/0299340 A1 | 12/2011 | Samachisa et al. | |
| 2011/0303971 A1 * | 12/2011 | Lee | H01L 27/11551 257/324 |
| 2012/0112156 A1 | 5/2012 | Park et al. | |
| 2012/0286226 A1 | 11/2012 | Seong et al. | |
| 2013/0037774 A1 * | 2/2013 | Song | H01L 27/249 257/2 |
| 2013/0200326 A1 * | 8/2013 | Ju | H01L 45/08 257/4 |
| 2013/0328005 A1 * | 12/2013 | Shin | H01L 27/2436 257/1 |

* cited by examiner

*Primary Examiner* — Allison P Bernstein
(74) *Attorney, Agent, or Firm* — Myers Bigel & Sibley, P.A.

(57) ABSTRACT

Variable resistance memory devices and methods of forming the same are disclosed. The devices may include an additional barrier layer that is a portion of a variable resistance layer and that is formed before forming a horizontal electrode layer. Due to the presence of the additional barrier layer, it may be possible to cure loss or damage of the variable resistance layer.

3 Claims, 36 Drawing Sheets

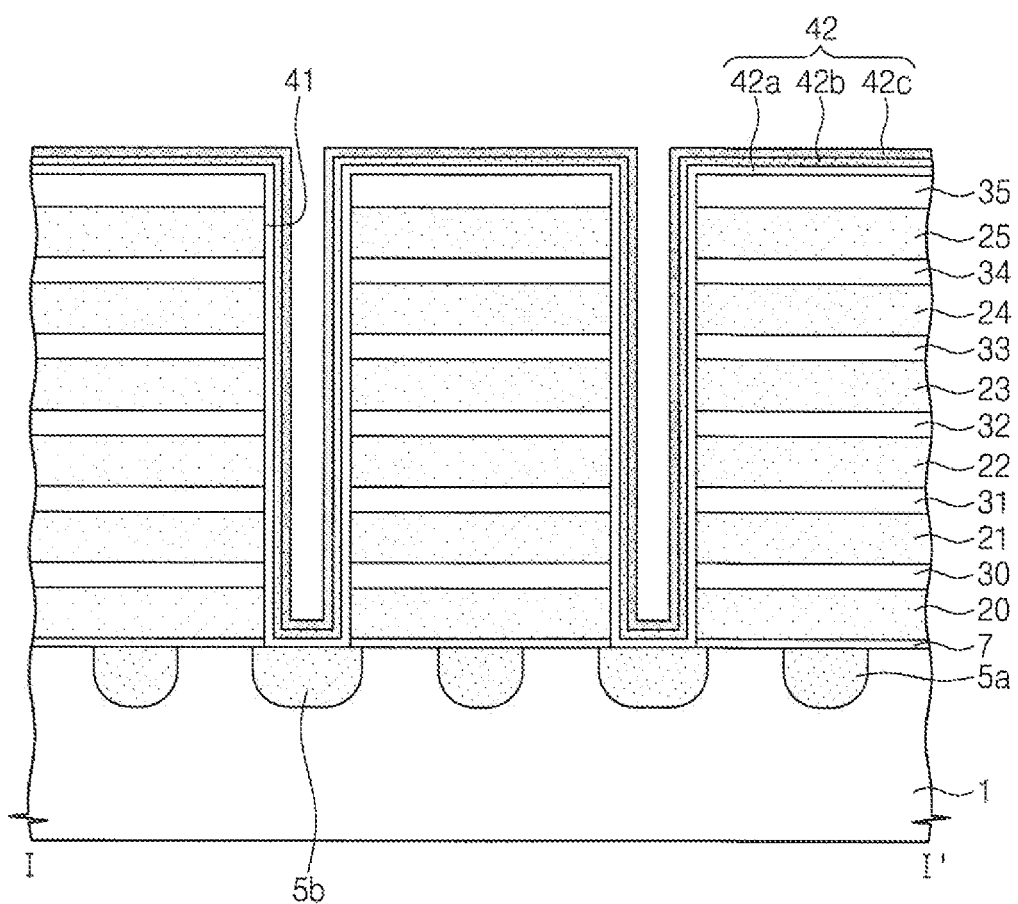

VARIABLE RESISTANCE MEMORY DEVICE AND METHODS OF FORMING THE SAME

CROSS-REFERENCE TO RELATED APPLICATIONS

This U.S. application is a continuation of U.S. patent application Ser. No. 14/022,984, filed Sep. 10, 2013, which itself claims priority under 35 U.S.C. §119 to Korean Patent Application No. 10-2012-0101872, filed on Sep. 14, 2012, in the Korean Intellectual Property Office, the disclosure of which is hereby incorporated by reference.

BACKGROUND

Example embodiments of inventive concept relate to variable resistance memory devices and/or methods of fanning the same.

Next-generation semiconductor memory devices (e.g., a ferroelectric random access memory (FRAM), a magnetic random access memory (MRAM), a phase-change random access memory (PRAM), and so forth) are being developed to satisfy increasing demands for high performance and low power consumption of semiconductor memory devices. In the next-generation semiconductor memory devices, memory elements may be formed of non-volatile and variable resistance materials. In such devices, the memory element may exhibit an electric resistance that can be selectively changed depending on a current or voltage applied thereto, and data stored in the memory element may be preserved even when a current or voltage is not supplied.

As semiconductor devices become highly integrated, variable resistance memory devices may become more prevalent.

SUMMARY

Example embodiments of the inventive concept provide variable resistance memory devices and methods of fabricating variable resistance memory devices.

According to some embodiments of the inventive concepts, a variable resistance memory device may include a layer, a vertical electrode on the layer, horizontal electrode layers and insulating layers sequentially and alternately stacked on the layer, the horizontal electrode layers and the insulating layers being adjacent to the vertical electrode. A variable resistance layer is between the vertical electrode and the horizontal electrode layers. The variable resistance layer may include a switching layer interposed between the vertical electrode and the horizontal electrode layer and between the vertical electrode and the insulating layer, a first bather layer interposed between the switching layer and the insulating layer, and a second barrier layer interposed between the switching layer and the horizontal electrode layer and between the insulating layer and the horizontal electrode layer.

In some embodiments, the device may further include an oxygen exchange layer being in contact with the switching layer.

In some embodiments, at least one of the switching layer and the oxygen exchange layer may include a nonstoichiometric transition metal oxide.

In some embodiments, the first and second barrier layers may include a stoichiometric transition metal oxide.

In some embodiments, the device may further include a third barrier layer interposed between the vertical electrode and the switching layer.

In some embodiments, at least one of the that and second barrier layers may be thinner than the switching layer.

In some embodiments, an interface between the first and second barrier layers has a curved profile.

In some embodiments, at least one of the first and second barrier layers contains metal oxide, whose metal element may be different from metal elements contained in the switching layer.

In some embodiments, the horizontal electrode layer may include a plurality of odd-numbered word lines and a plurality of even-numbered word lines alternatingly stacked on the layer. The odd--numbered word lines may be electrically connected to each other, and the even-numbered word lines may be electrically connected to each other but may be electrically isolated from the odd-numbered word lines.

In some embodiments, the device may further include a selection gate electrode provided between the layer and a horizontal electrode layer that is closest to the layer, a selection gate insulating layer interposed between the selection gate electrode and the layer, and first and second doped regions provided in the layer, the first and second doped regions being formed at opposing sides of the selection gate electrode.

According to some embodiments of the inventive concepts, methods of fabricating a variable resistance memory device may include alternatingly stacking a plurality of sacrificial layers and a plurality of insulating layers on a layer, patterning the insulating layers and the sacrificial layers to form a vertical electrode hole, forming a first barrier layer to cover a sidewall of the vertical electrode hole, forming a switching layer to cover a sidewall of the first barrier layer, forming a vertical electrode to fill the vertical electrode hole, the vertical electrode being connected to the layer, patterning the insulating layers and the sacrificial layers to form a groove spaced apart from the vertical electrode hole, removing the sacrificial layers through the groove to form an empty space, conformally forming a second barrier layer in the empty space, and filling the empty space with a horizontal electrode layer.

In some embodiments, the first barrier layer may be partially removed during the removing of the sacrificial layers through the groove.

In some embodiments, the forming of the second barrier layer and the horizontal electrode layer may be performed in an in-situ manner.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 12A are plan views sequentially illustrating a process of fabricating the variable resistance memory device described with reference to FIG. 2A.

FIGS. 3B through 12B are sectional views taken along line I-I' of FIGS. 3A through 12A, respectively.

FIGS. 3C through 12C are sectional views taken along line II-II' of FIGS. 3A through 12A, respectively.

Figure 1:
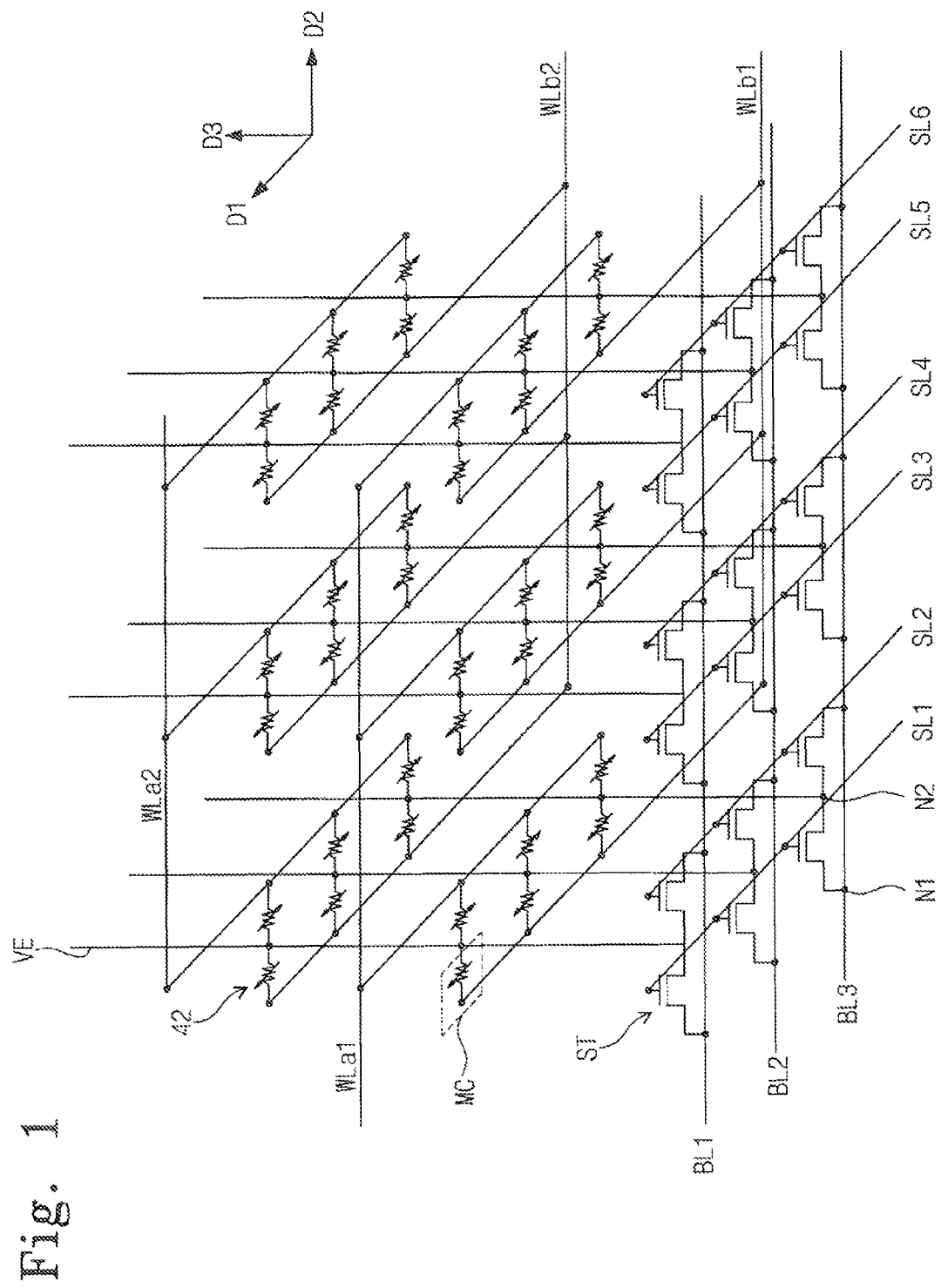
FIG. 1 is a circuit diagram of a variable resistance memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent" "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described, as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

FIG. 1 is a circuit diagram of a variable resistance memory device according to example embodiments of the inventive concept.

Referring to FIG. 1, a variable resistance memory device according to some embodiments of inventive concepts may include a plurality of memory cells MC arranged in a matrix form. The memory cells MC may include variable resistance devices 42, respectively. The variable resistance devices 42 may be connected to selection transistors ST via word lines WLa1, WLb1, WLa2, and WLb2. The word tines WLa1 WLb1, WLa2, and WLb2 may extend along a first direction D1 The variable resistance devices 42 may include, for example, transition metal oxides. The variable resistance memory devices may be used to realize a resistance random access memory (RRAM). The variable resistance devices 42 may have an electric resistance that may be selectively changed depending o an amount of electric current supplied through the selection transistors ST.

The selection transistors ST may be disposed between the variable resistance devices 42 and the bit lines BL1, BL2, and BL3 to connect them with each other. The bit lines BL1, BL2, and BL3 may extend along a second direction D2, which may be orthogonal to the first direction D1. The selection transistors ST may include gate electrodes connected to selection lines SL1-SL6. The selection transistors ST may include a second node N2 connected to a vertical electrode VE and a first node NI connected to the corresponding one of the bit lines BL1, BL2, and BL3. The vertical electrodes VE may extend along a third direction D3 that may be orthogonal to both the first direction Di and the second direction D2. The first, second, and third directions D1, D2, and D3 may cross each other. Each of the vertical electrodes VE may be connected to a plurality of the variable resistance devices 42 provided at different levels from each other. A pair of the selection transistors ST adjacent to each other may share one of the bit lines BL and one of the vertical electrodes VE.

The word lines WLa1, WLb1, WLa2, and WLb2 may be disposed at several levels, and may be parallel to each other. Odd-numbered ones WLa1 of the word lines WLa1 and WLb1 disposed at a first level may be connected to each other. Even-numbered ones WLb1 of the word lines WLa1 and WLb1 disposed at the first level may be connected to each other but may be electrically isolated from the odd-numbered word lines WLa1. Odd-numbered ones WLa2 of the word lines WLa2 and WLb2 disposed at a second level may be connected to each other. Even-numbered ones WLb2 of the word lines WLa2 and WLb2 disposed at the second level may be connected to each other but be electrically isolated from the odd-numbered word lines WLa2.

While FIG. 1 illustrates a circuit diagram including three hit lines BL1 to BL3, two odd word lines WLa1 and WLa2, and two even word lines WLb1 and WLb2, example embodiments of inventive concept are not limited thereto and may include more than three bit lines and/or more than two even and/or odd word lines.

Figure 2A:
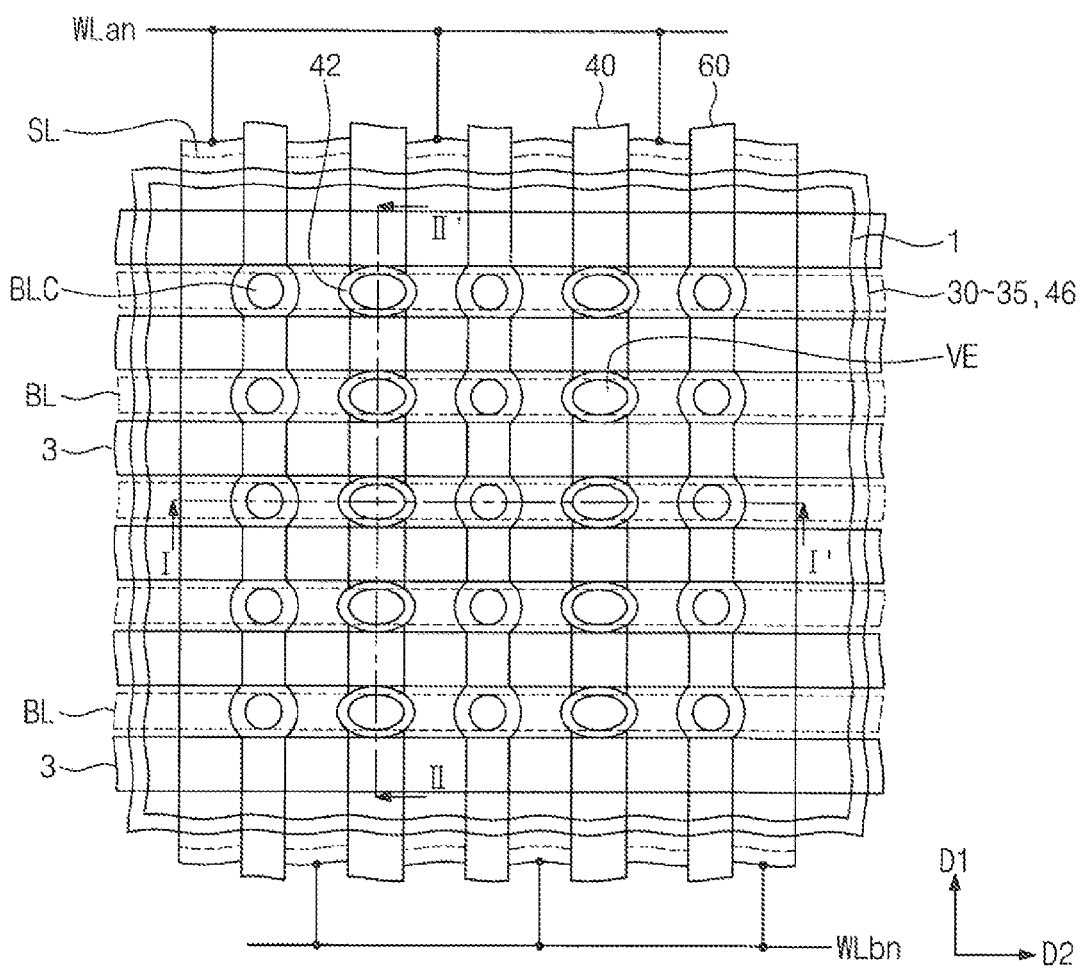
FIG. 2A shows a plan view of a variable resistance memory device according to example embodiments of the inventive concept.
Figure 2B:
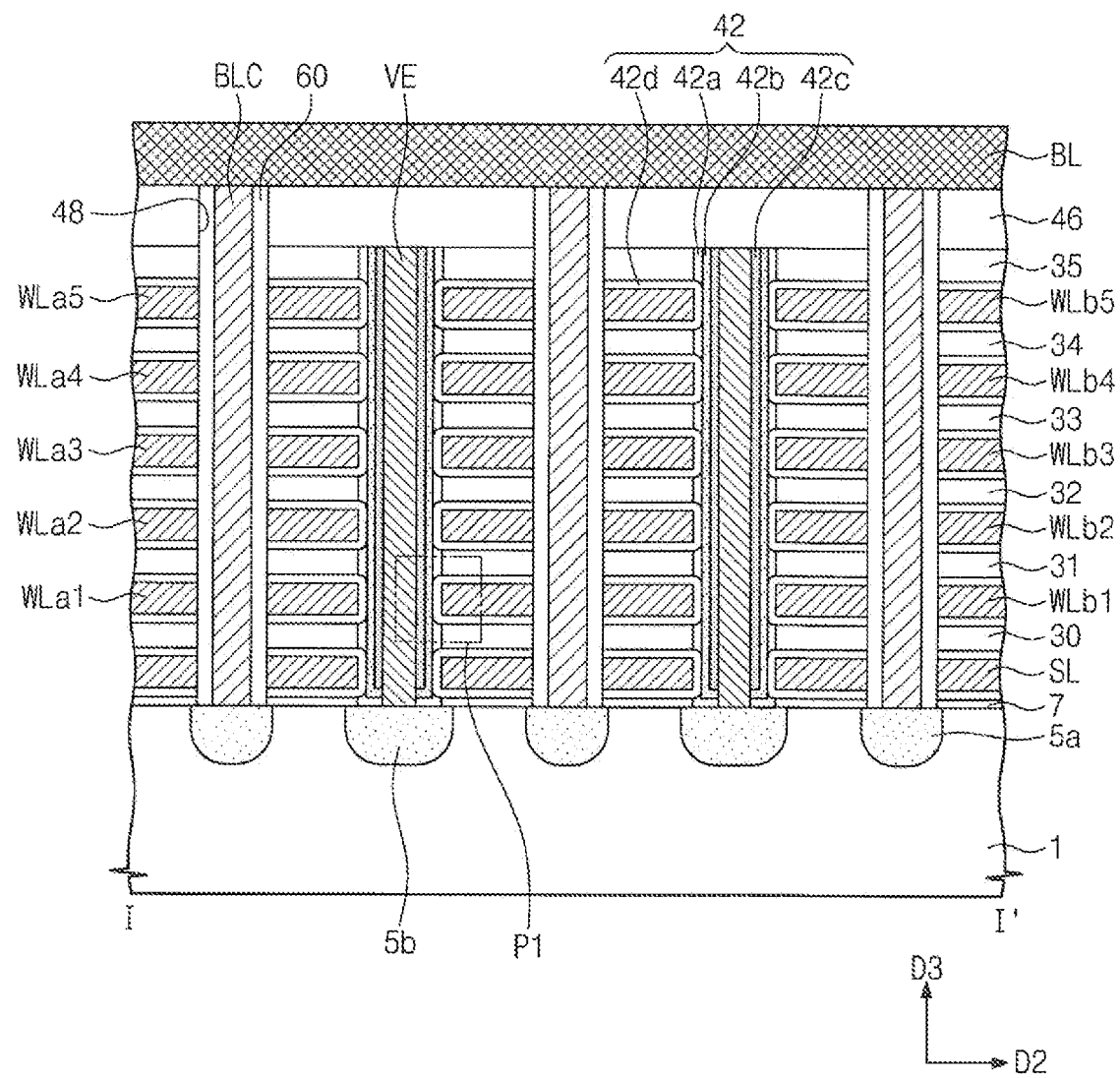
FIGS. 2B and 2C are sectional views taken along lines I-I' and II-II' of FIG. 2A, respectively.
Figure 2C:
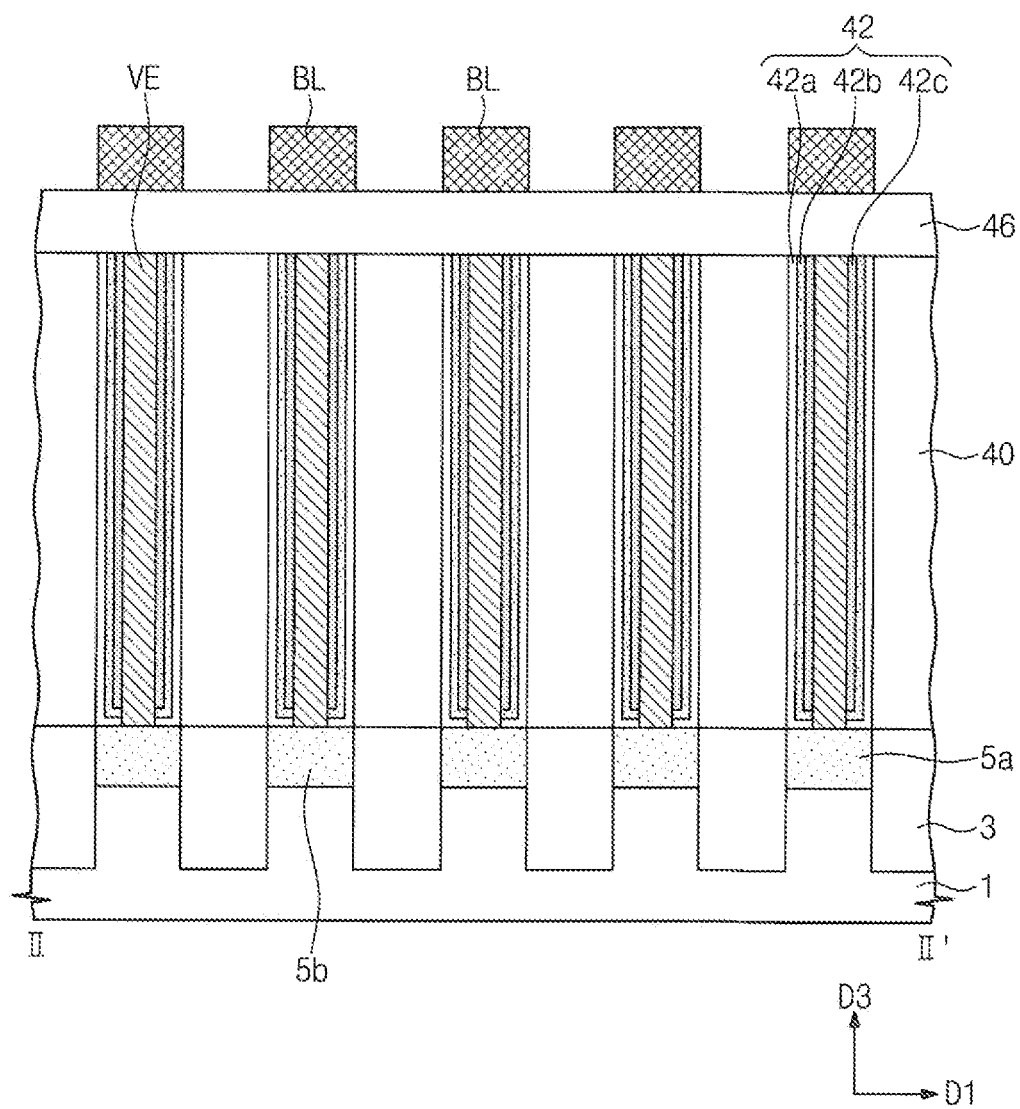
Figure 2D:
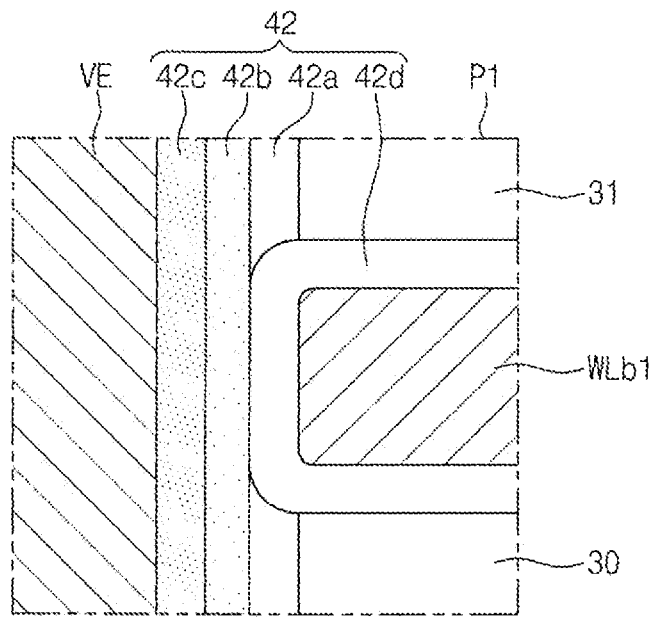
FIGS. 2D through 2F are enlarged sectional views of a portion P1 of FIG. 2B.
Figure 2E:
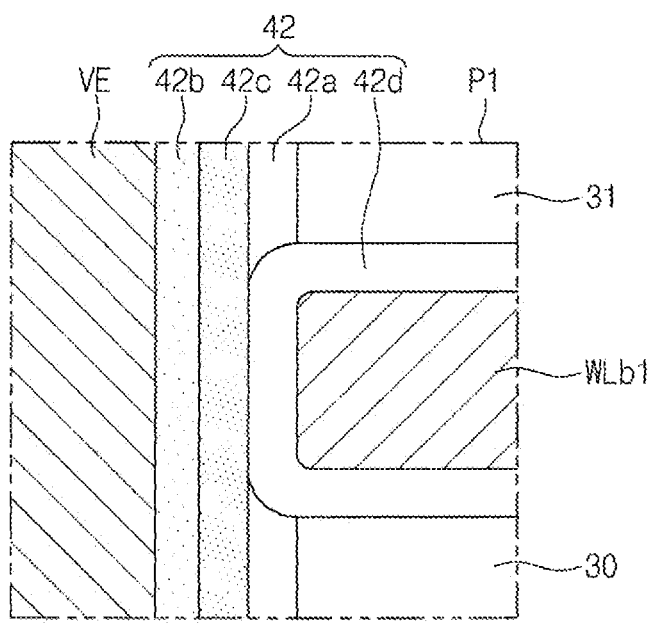
Figure 2F:
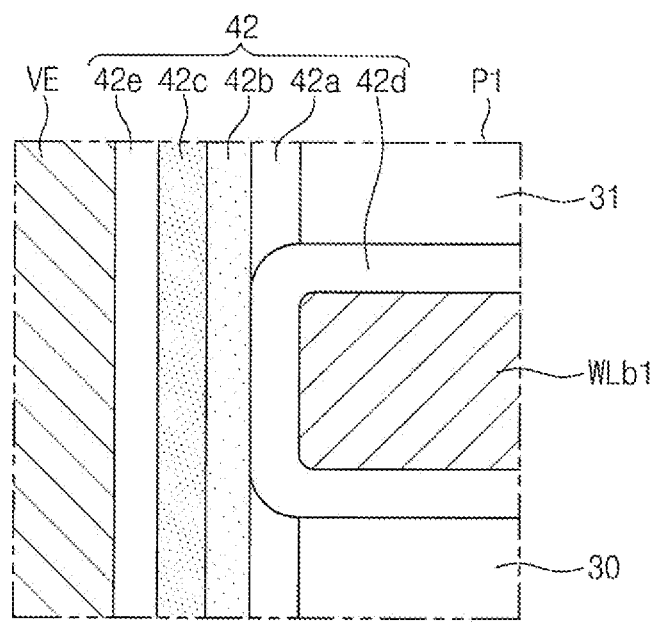

FIG. 2A shows a plan view of a variable resistance memory device according to some embodiments of the inventive concepts. FIGS. 2B and 2C are sectional views taken along lines I-I' and II-II' of FIG. 2A, respectively, and FIGS. 2D through 2F are enlarged sectional views of a portion P1 of FIG. 2B.

Referring to FIGS. 2A through 2D, a plurality of device isolation layers 3 may be formed in a layer 1, which may be a semiconductor substrate. Hereinafter, the layer 1 will be referred to as a substrate 1; however, it will be appreciated that the layer 1 deed not be a bulk semiconductor substrate but could, for example, include an epitaxial semiconductor or other layer. The device isolation layers 3 may be shaped like lines parallel to each other. The device isolation layers 3 may extend along the second direction D2. First doped regions 5a and second doped regions 5b may be alternatingly arranged in the substrate 1 between the device isolation layers 3. A selection gate insulating layer 7 may be provided on the substrate 1. Selection lines SL and a first insulating layer 30 may be sequentially provided on the selection gate insulating layer 7. The selection lines SL may extend along the first direction D1 and be parallel with each other. In some embodiments, each of the selection transistors ST may include one of the selection lines SL, the selection gate insulating layer 7 disposed there under, and the first and second doped regions 5a and 5b adjacent thereto. A portion of the substrate 1 below the selection line SL and between the first and second doped regions 5a and 5b may serve as a channel region. The first doped region 5a may correspond to the first node N1, and the second doped region 5b may correspond to the second node N2.

A plurality of horizontal electrode layers and a plurality of word line interlayer insulating layers may be alternatingly disposed on the first insulating layer 30. In some embodiments, the horizontal electrode layers may include first to fifth horizontal electrode layers, and the word line interlayer insulating layers may include first to fifth word line interlayer insulating layers 31, 32, 33, 34, and 35.

Furthermore, each of the horizontal electrode layers may include a plurality of word lines WLan and WLbn, which may be disposed on a single plane that is parallel to the first direction D1, where n denotes a stacking order of the word line and n may an integer greater than I. For example, the first horizontal electrode layer, which is closest to the substrate 1, may include the first odd-numbered word lines WLa1 and the first even-numbered word lines WLb1. The second horizontal electrode layer disposed on the first horizontal electrode layer may include the second odd-numbered word lines WLa2 and the second even-numbered word lines WLb2. The third horizontal electrode layer disposed on the second horizontal electrode layer may include the third odd-numbered word lines WLa3 and the third even-numbered Word lines WLb3. The fourth horizontal electrode layer disposed on the third horizontal electrode layer may include the fourth odd-numbered word lines WLa4 and the fourth even-numbered word lines WLb4. The fifth horizontal electrode layer, which is the uppermost layer of the horizontal electrode layers, may include the fifth odd-numbered word lines WLa5 and the fifth even-numbered word lines WLb5.

In each level, the odd-numbered word lines WLan may be electrically connected to each other, while even-numbered word lines WLbn may be electrically connected to each other and may be electrically isolated from the odd-numbered word lines WLan. Furthermore, ones of the word lines WLan and WLbn vertically separated from each other may be electrically isolated from each other. For example, the even-numbered word lines WLbn on a given level may be electrically isolated from other even-numbered word lines disposed thereon or there under. Example embodiments of inventive concept are not limited to five horizontal electrode layers.

The vertical electrode VE may penetrate the word line interlayer insulating layers 31, 32, 33, 34, and 35 between the odd-numbered word lines WLan and the even-numbered word lines WLbn and may be in contact with the second doped region 5b. The vertical electrode VE and the horizontal electrode layer WLan and WLbn (n=1, 2, ..., and 5) may be formed using at least one of titanium nitride, tungsten, platinum, lead, rhodium, ruthenium, or iridium, The variable resistance layer 42 may be interposed between the vertical electrode VE and the horizontal electrode layers WLan and WLbn (n=1, 2, ..., and 5).

Referring to FIGS. 2B, 2C and 2D, the variable resistance layer 42 may include a switching layer 42e, an oxygen-exchanging layer 42b, a first barrier layer 42a, and a second barrier layer 42d. The switching layer 42c may be interposed between the vertical electrode VE and the horizontal electrode layer WLan and WLbn (n=1, 2, . . . , and 5). The switching layer 42c may be provided to surround or cover substantially the entire outer sidewall of the vertical electrode VE. The switching layer 42c may be a layer exhibiting variable resistance characteristics. For example, in the switching layer 42c, electric paths such as filaments may be selectively formed depending on a voltage difference applied between the vertical electrode VE and the horizontal electrode layer WLan and WLbn (n=1, 2, . . . , and 5). In some embodiments, the switching layer 42c may include a transition metal oxide layer. For example, the switching layer 42c may include at least one of oxides of zirconium (Zr), hafnium (Hf), aluminum (Al), nickel (Ni), copper (Cu), molybdenum (Mo), tantalum (Ta), titanium (Ti), and/or tungsten (W). In some embodiments, the materials for the switching layer 42c may include a non-stoichiometric transition metal oxide. For example, the switching layer 42c may have oxygen content that is smaller by about 10-20% than that of its stoichiometric ratio.

Further, the oxygen-exchanging layer 42b may be in contact with the switching layer 42c. The oxygen-exchanging layer 42b may be interposed (1) between the switching layer 42c and the horizontal electrode layer WLan and WLbn (n=1, 2, . . . , and 5) as shown in FIG. 2D or (2) between the switching layer 42c and the vertical electrode VE as shown in FIG. 2E. The oxygen-exchanging layer 42b may be configured to exchange oxygen atoms with the switching layer 42c. Oxygen atoms may be partially moved from the switching layer 42c to the oxygen-exchanging layer 42b by a voltage difference between the vertical electrode VE and the horizontal electrode layer WLan and WLbn (n=1, 2, . . . , and 5), and thus, the switching layer 42c may have a low resistance state, which may correspond to a programmed state. Conversely, if oxygen atoms are moved from the oxygen-exchanging layer 42b to the switching layer 42c, the switching layer 42c may have a high resistance state, which may correspond to an erased state. In some embodiments, the oxygen-exchanging layer 42b may be formed of an oxide layer containing the same transition metal elements as the switching layer 42c. For example, the oxygen-exchanging layer 42b may include at least one of oxides of zirconium (Zr), hafnium (Hf), aluminum (Al) nickel (Ni), copper (Cu), molybdenum (Mo), tantalum (Ta), titanium (Ti), and/or tungsten (W). The oxygen-exchanging layer 42b may have higher oxygen content than that of the switching layer 42c and be formed of non-stoichiometric transition metal oxides.

The first barrier layer 42a may be interposed between the vertical electrode VE and the interlayer insulating layers 31, 32, 33, 34, and 35. The first barrier layer 42a may be interposed between the oxygen-exchanging layer 42b and the interlayer insulating layers 31-35, as shown in FIG. 2D, or between the switching layer 42c and the interlayer insulating layers 31-35 as shown in FIG. 2E. The second barrier layer 42d may be interposed between the oxygen-exchanging layer 42b and the horizontal electrode layer WLan and WLbn (n=1, 2, . . . , and 5), as shown in FIG. 2D or between the switching layer 42c and the horizontal electrode layer WLan and WLbn (n=1, 2, . . . , and 5) as shown in FIG. 2E. The second barrier layer 42d may extend to be interposed between the horizontal electrode layer WLan and WLbn (n=1, 2, . . . , and 5) and the interlayer insulating layer 31-35. The second barrier layer 42d may be in contact with the switching layer 42c or the oxygen-exchanging layer 42b.

As shown in FIG. 2F, the variable resistance layer 42 may further include a third barrier layer 42e. The third barrier layer 42e may be interposed between the vertical electrode VE and the switching layer 42c. In some embodiments, each of the first to third barrier layers 42a, 42d, and 42e may include a transition metal oxide having metal elements that are different from transition metals contained in the switching layer 42c. In some embodiments, the first to third barrier layers 42a, 42d, and 42e may be the same layer. In other embodiments, at least one of the first to third barrier layers 42a, 42d, and 42e may be different from the other(s). Compared to the switching layer 42c and the oxygen-exchanging layer 42b, the first to third barrier layers 42a, 42d, and 42e may be more stable and more stoichiometric (i.e. closer to their stoichiometic conditions). Due to the presence of the first to third barrier layers 42a, 42d, and 42e, it is possible to reduce/prevent oxygen atoms in the switching layer 42c and the oxygen-exchanging, layer 42b from being exhausted to the outside and to reduce/prevent the electrodes VE, WLan and WLbn (n=1, 2, . . . , and 5) from chemically or physically reacting with the variable resistance layer 42. In certain embodiments, the second barrier layer 42d or the third barrier layer 42e may serve as a tunneling barrier layer. Each or all of the first to third barrier layers 42a, 42d, and 42e may have a smaller thickness than at least one of the switching layer 42c and the oxygen-exchanging layer 42b.

An interface between the first barrier layer 42a and the second barrier layer 42d may be curved or rounded. For example, the second barrier layer 42d may have a rounded sectional profile around corners of the vertical electrode layer adjacent to the vertical electrode VE.

The variable resistance layer 42 may include a transition metal oxide. In this case, for example, the variable resistance memory device may be a resistance random access memory (RRAM). The variable resistance layer 42 may extend to be interposed between the vertical electrode VE and the word line interlayer insulating layers 31-35.

Referring back to FIGS. 2A through 2C, a second insulating layer 46 may be provided on the fifth word line interlayer insulating layer 35. A plurality of bit lines BL may be provided on the second insulating layer 46. The bit lines EL may be parallel to ea other along the second direction D2.

Referring to FIG. 2C, a first insulating gap-fill layer 40 may be interposed between the vertical electrodes VE in the first direction D1. At least a portion of the variable resistance layer 42 may extend between the first insulating gap-fill layer 40 and the vertical electrode VE. Referring to FIG. 28, a second insulating gap-fill layer 60 may be disposed between the vertical electrodes VE, which are adjacent to each other in the second direction D2, and be spaced apart from the vertical electrodes VE. The second insulating gap-fill layer 60 may include a plurality of line shaped patterns extending along the first direction D1 and being parallel to each other. In some embodiments, the second insulating gap-fill layer 60 may separate the word lines WLan and WLbn from the selection lines SL. The second insulating gap-fill layer 60 may penetrate the second insulating layer 46, the word line interlayer insulating layers 31-35, the first insulating layer 30, the selection line SL, and the selection gate insulating layer 7 to contact the bit line BL and the first doped regions 5a between the odd-numbered word lines WLan and the even-numbered word lines WLbn. A plurality of bit line contacts BLC spaced apart from each other may be provided in the second insulating gap-fill layer 60 to connect the bit line BL electrically to the first doped regions 5a.

Referring again to FIGS. 2D and 2E, according to some embodiments of the inventive concept, the variable resistance memory device may include the second barrier layer 42d that is provided at a region where the first barrier layer 42a may be removed. For example, the second barrier layer 42d may be provided between the oxygen exchange layer 42b and the horizontal electrode layer WLan and WLbn (n=1, 2, . . . , and 5). This may reduce/prevent the variable resistance layer from being deteriorated. Further, the second barrier layer 42d may be interposed between the interlayer insulating layers 30-35 and may have a relatively small thickness, compared to other layers in the variable resistance layer, and thus, it is possible to reduce/prevent a total thickness of the variable resistance memory device from drastically increasing.

FIGS. 3A through 12A are plan views sequentially illustrating methods of fabricating a variable resistance memory device described with reference to FIG. 2A, FIGS. 3B through 12B are sectional views taken along line I-I' of FIGS.

3A through 12A, respectively, and FIGS. 3C through 12C are sectional views taken along line II-II' of FIGS. 3A through 12A, respectively.

Figure 3A:
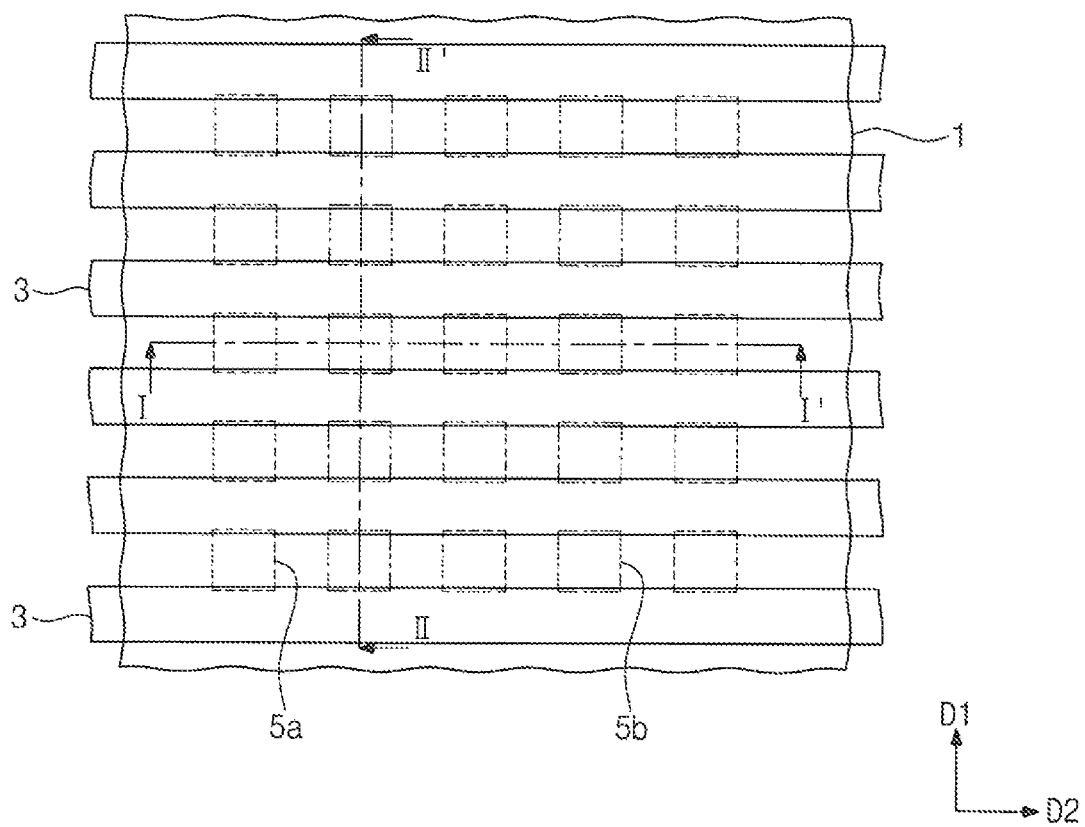
Figure 3B:
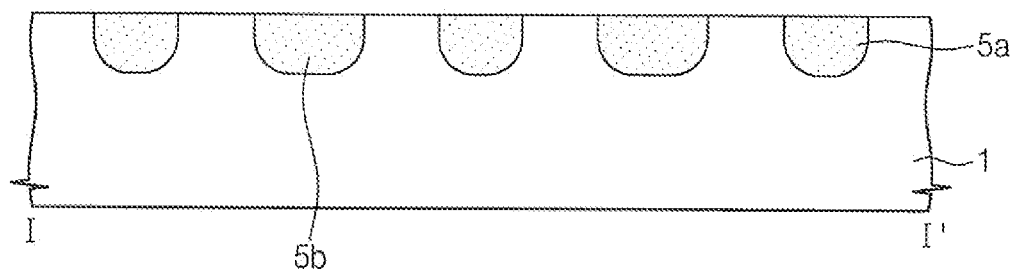
Figure 3C:
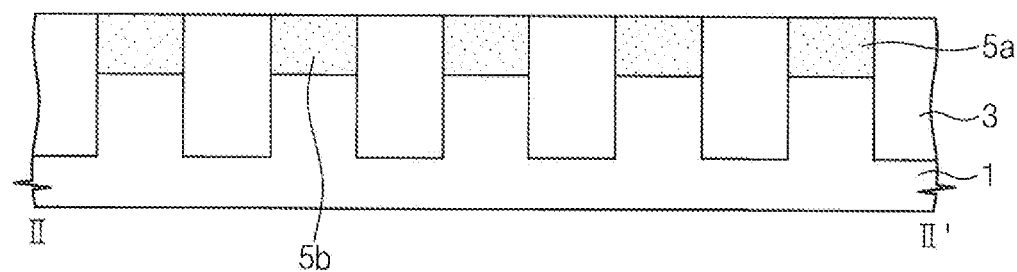

Referring to FIGS. 3A through 3C, a plurality of the device isolation layers 3 extending along the second direction D2 may be formed in the substrate 1 to be parallel to each other. The substrate 1 may be one of a single-crystalline silicon substrate, a silicon-on-insulator (SOI) substrate, or a silicon epitaxial layer. The device isolation layers 3 may be formed using, for example, a shallow trench isolation (STI) process. The device isolation layers 3 may be formed to define active regions. An ion implantation process may be performed to form a plurality of the first and second doped regions 5a and 5b, which may be shaped like island and which be provided in the active region between the device isolation layers 3. The second doped regions 5b may be formed to have a width greater than the first to doped regions 5a.

Figure 4A:
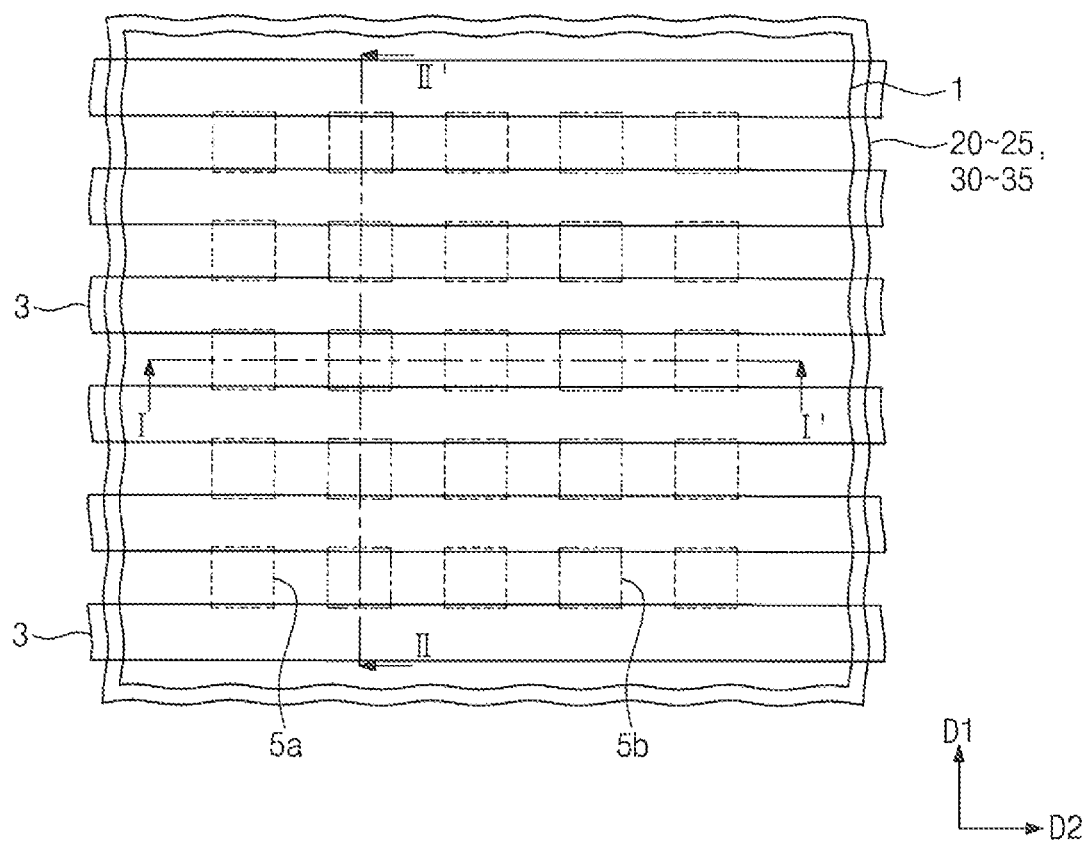
Figure 4B:
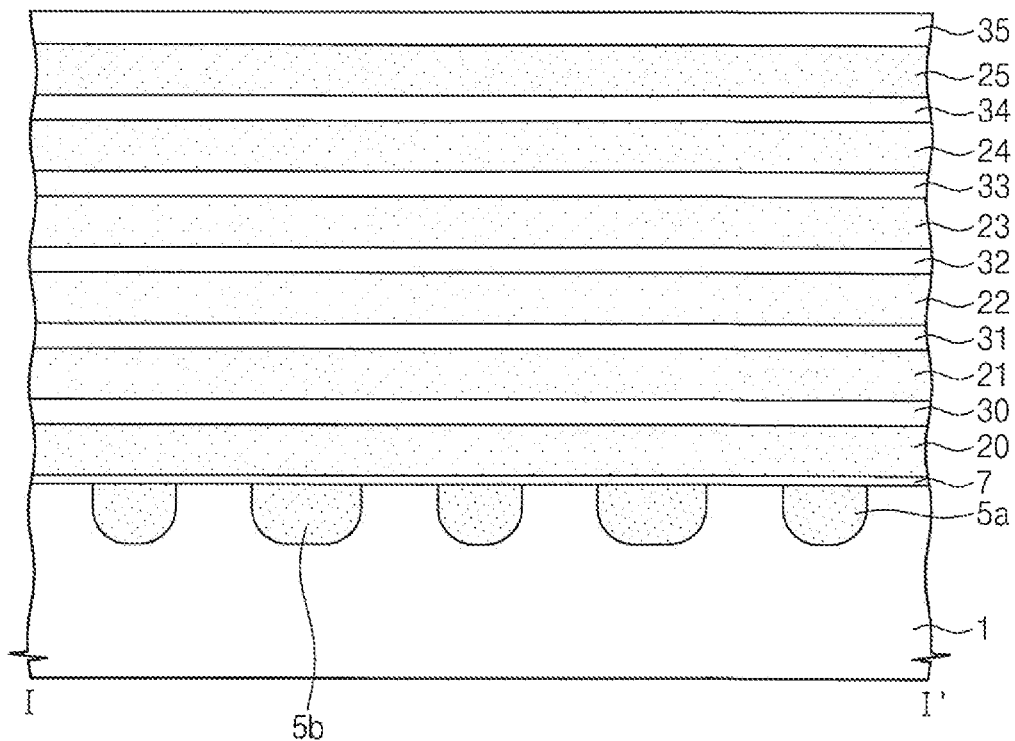
Figure 4C:
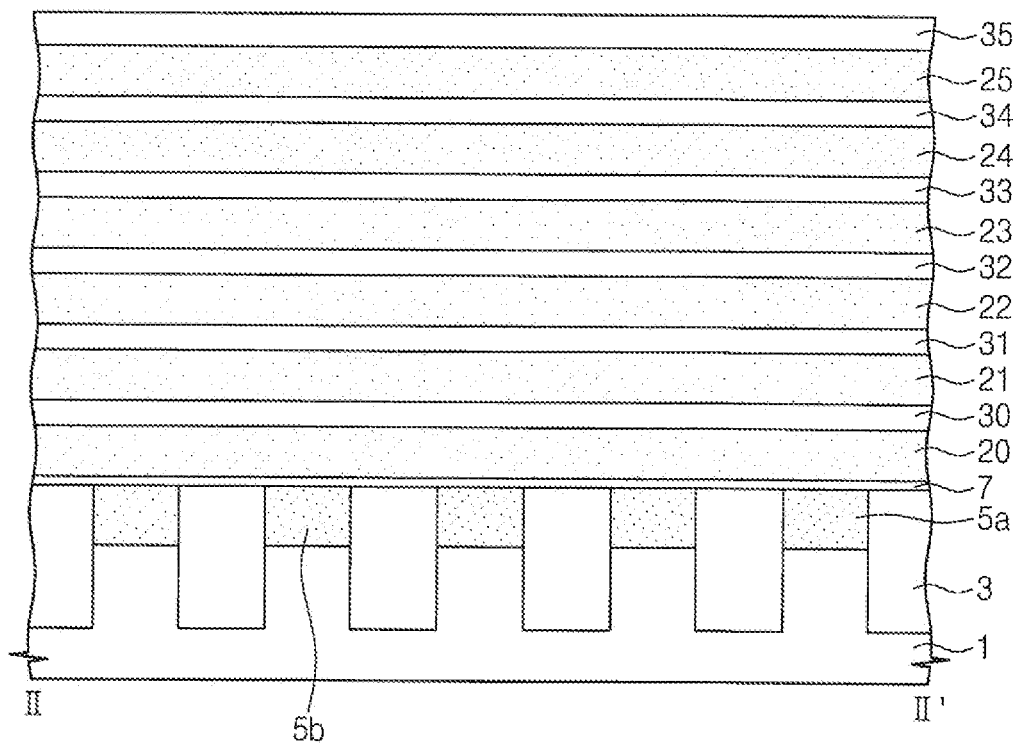

Referring to FIGS. 4A through 4C, a selection gate insulating layer 7, a selection sacrificial layer 20, a first insulating layer 30, first to fifth sacrificial layers 21-25, and word line interlayer insulating layers 31-35 may be sequentially stacked on the substrate 1. The first to fifth sacrificial layers 21-25 and the word line interlayer insulating layers 31-35 may be stacked in an alternating manner. The sacrificial layers 20-25 may be formed of materials having an etch selectivity with respect to the insulating layers 30-35. For example, the sacrificial layers 20-25 may be formed of silicon nitride, the insulating layers 30-35 may be formed of silicon oxide.

Figure 5A:
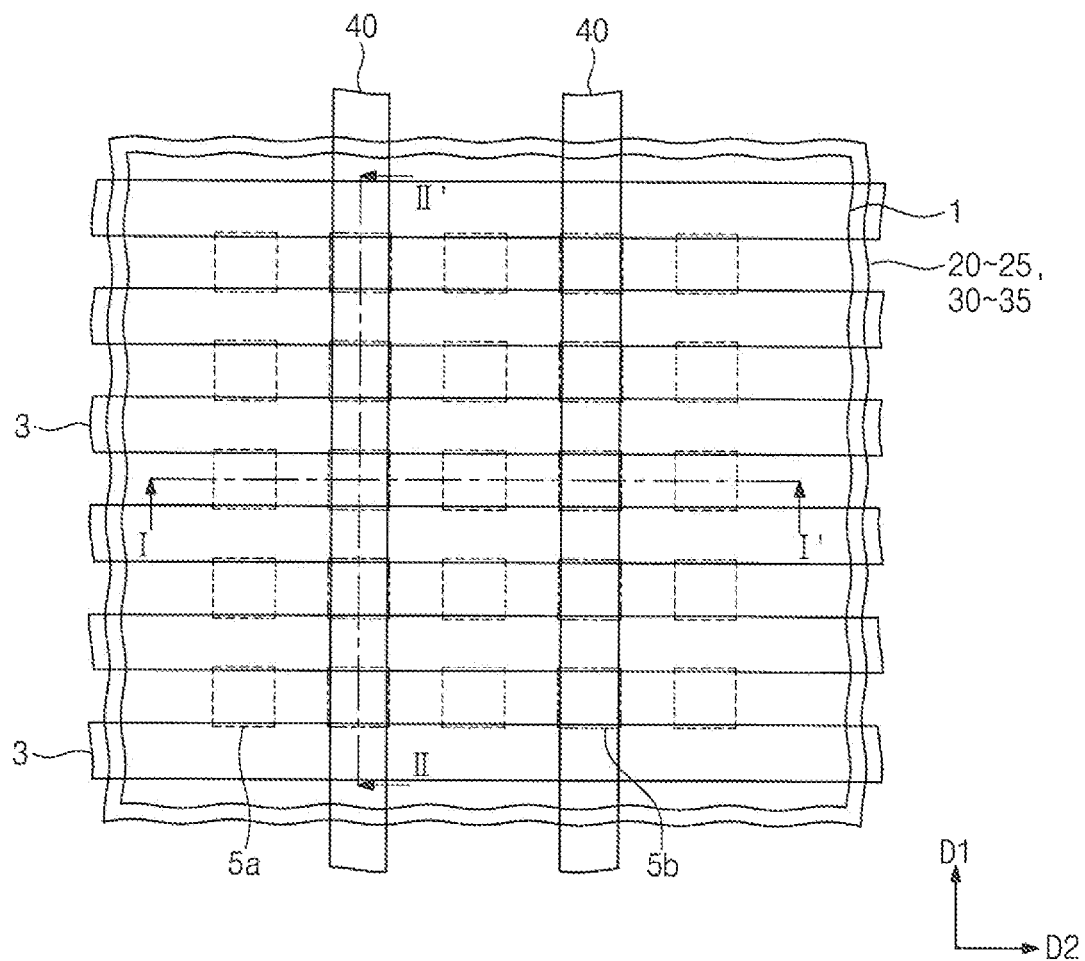
Figure 5B:
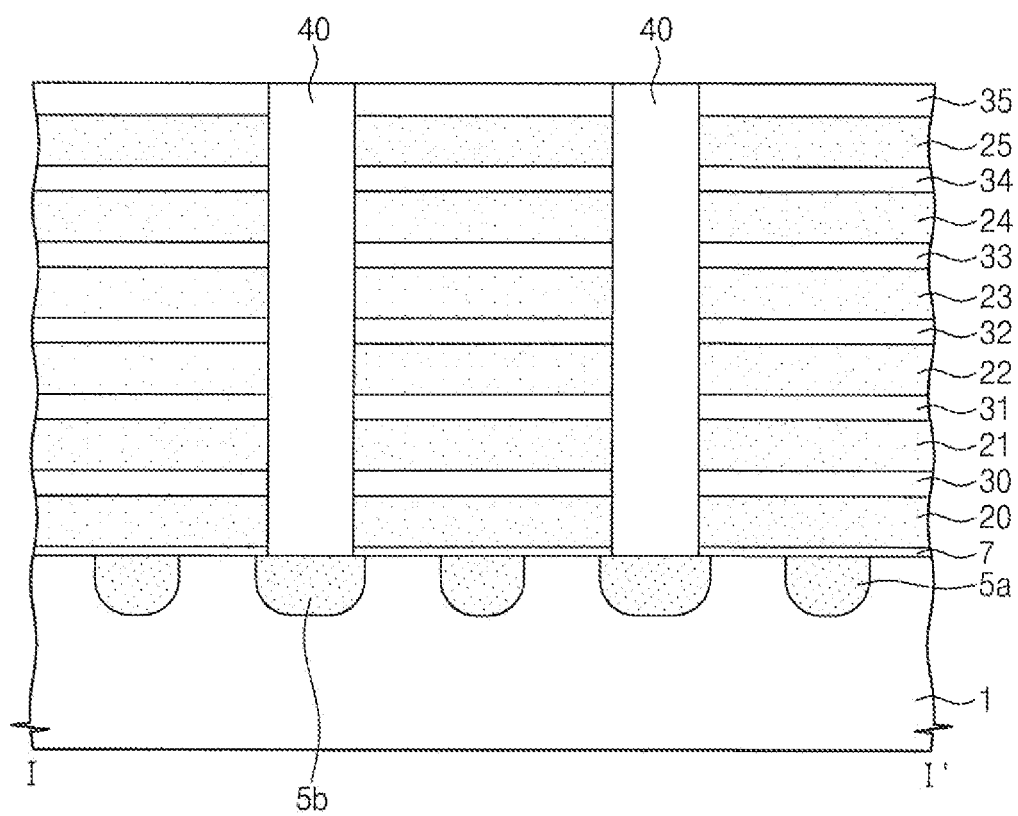
Figure 5C:
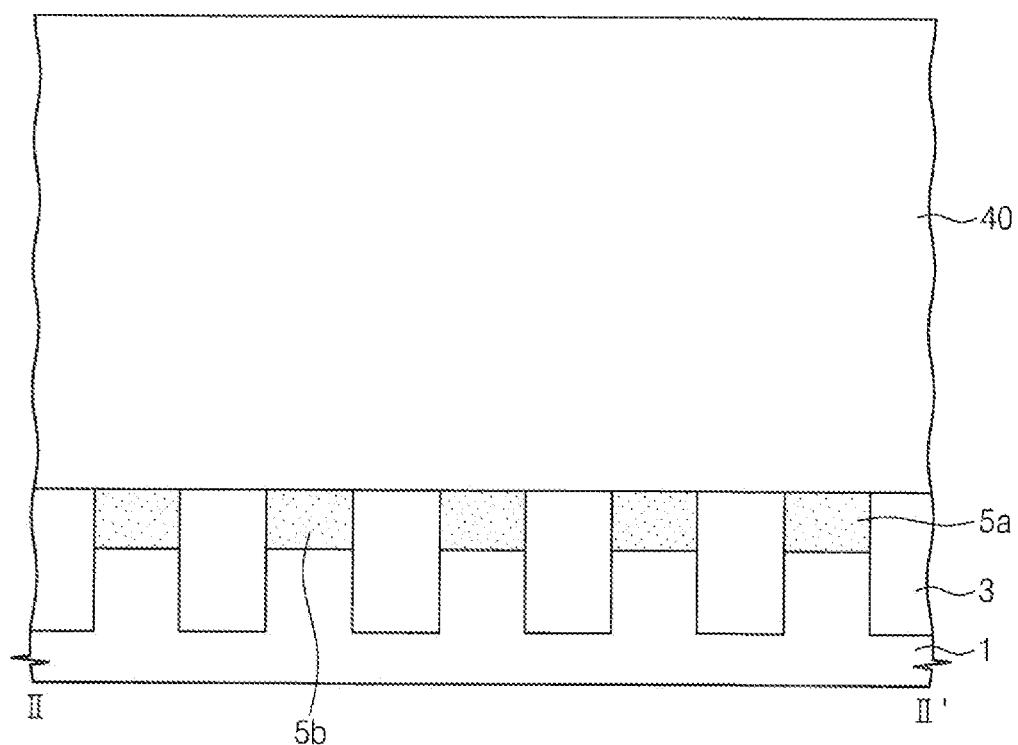

Referring to FIGS. 5A through 5C, the sacrificial layers 20-25, the insulating layers 30-35, and the selection gate insulating layer 7 may be patterned to form a plurality of grooves extending along the first direction D1, and the first insulating gap-fill layer 40 may be formed in each groove to be in contact with the second doped region 5b. The first insulating gap-fill layer 40 may be formed to include a plurality of line-shaped patterns extending along the first direction D1 and being parallel to each other. In some embodiments, the first insulating gap-fill layer 40 may be formed of, for example, silicon oxide.

Figure 6A:
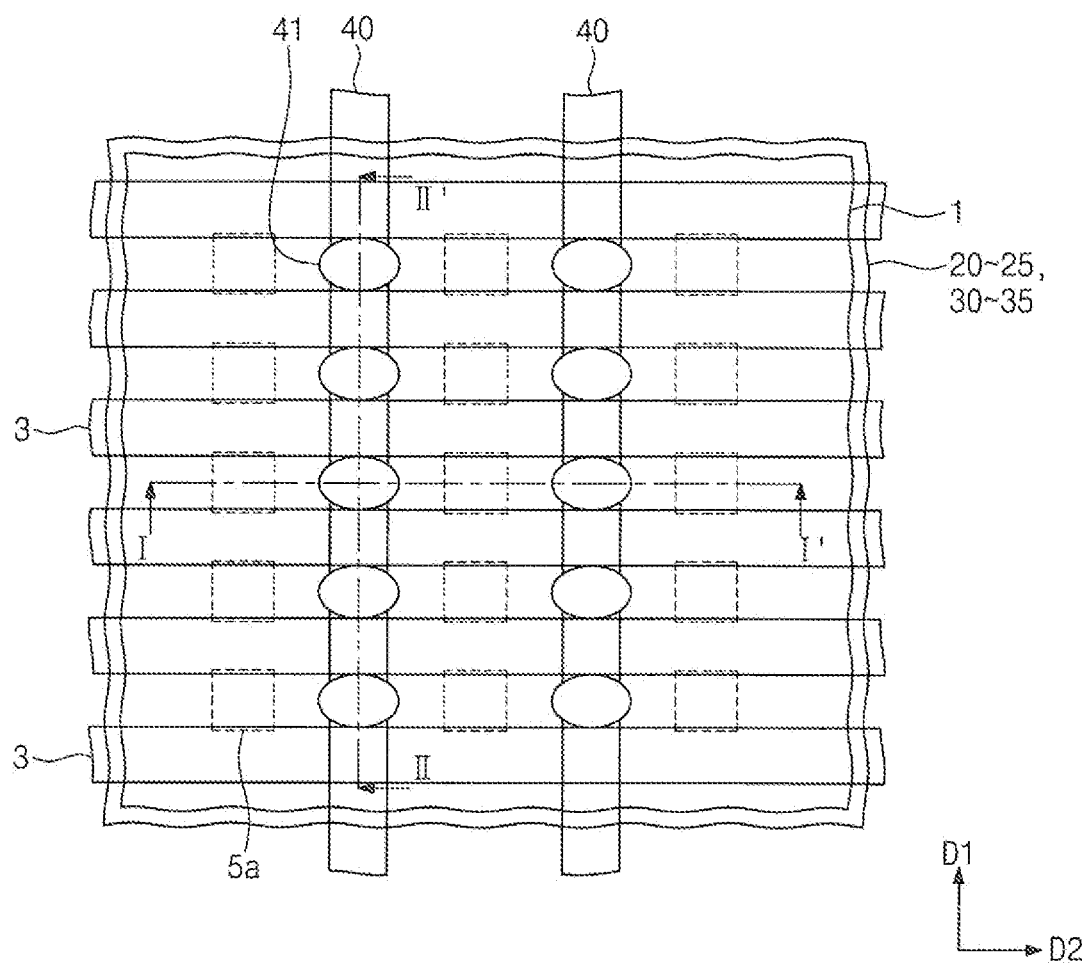
Figure 6B:
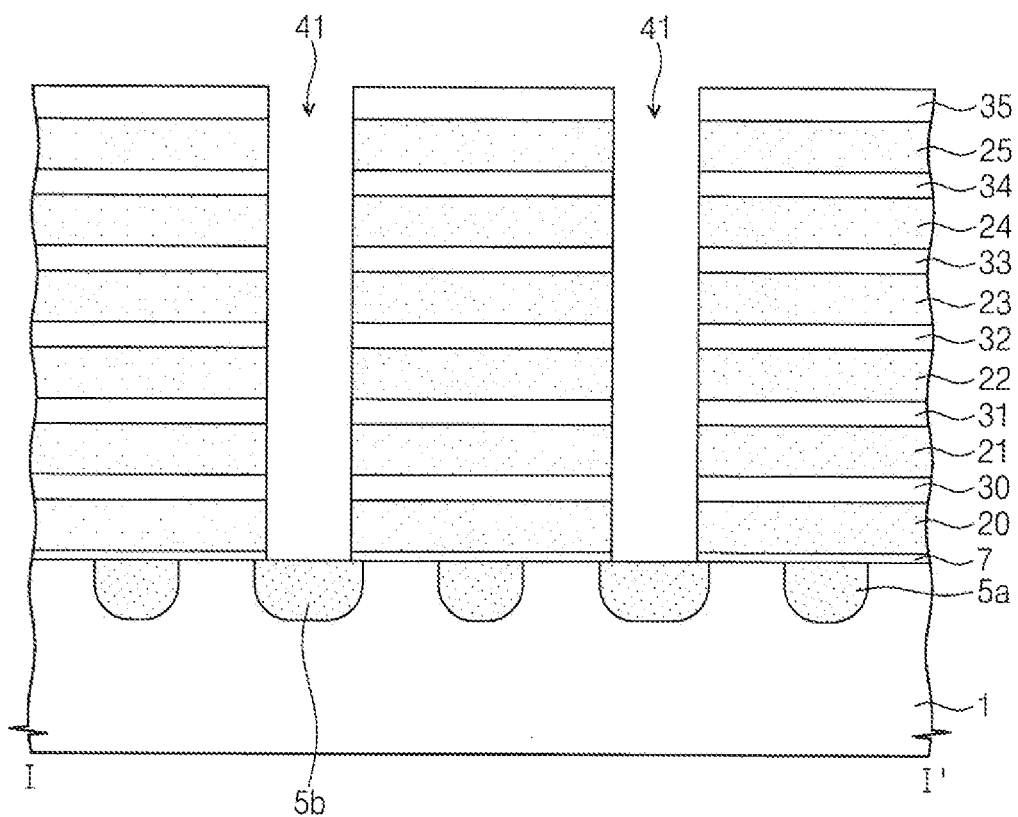
Figure 6C:
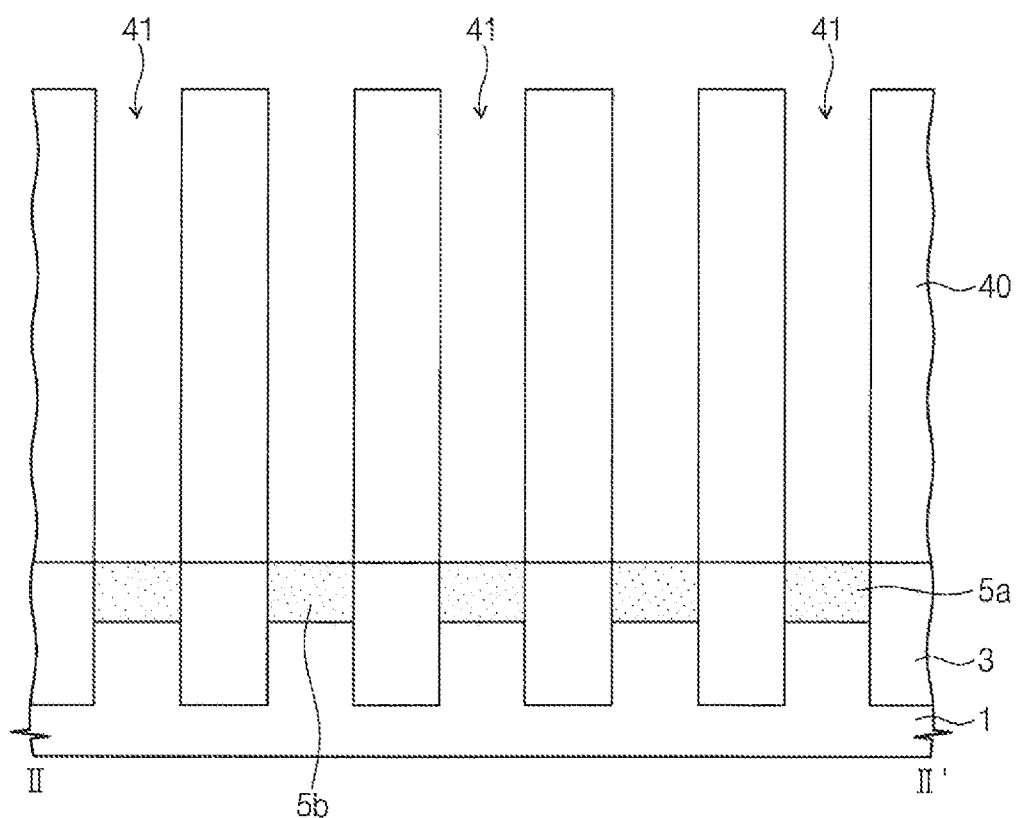

Referring to FIGS. 6A through 6C, an anisotropic etching process may be performed to remove a portion of the first insulating gap-fill layer 40, thereby forming a vertical electrode hole 41 exposing the second doped region 5b. The vertical electrode hole 41 may be formed to have a width greater than the first insulating gap-fill layer 40.

Figure 7A:
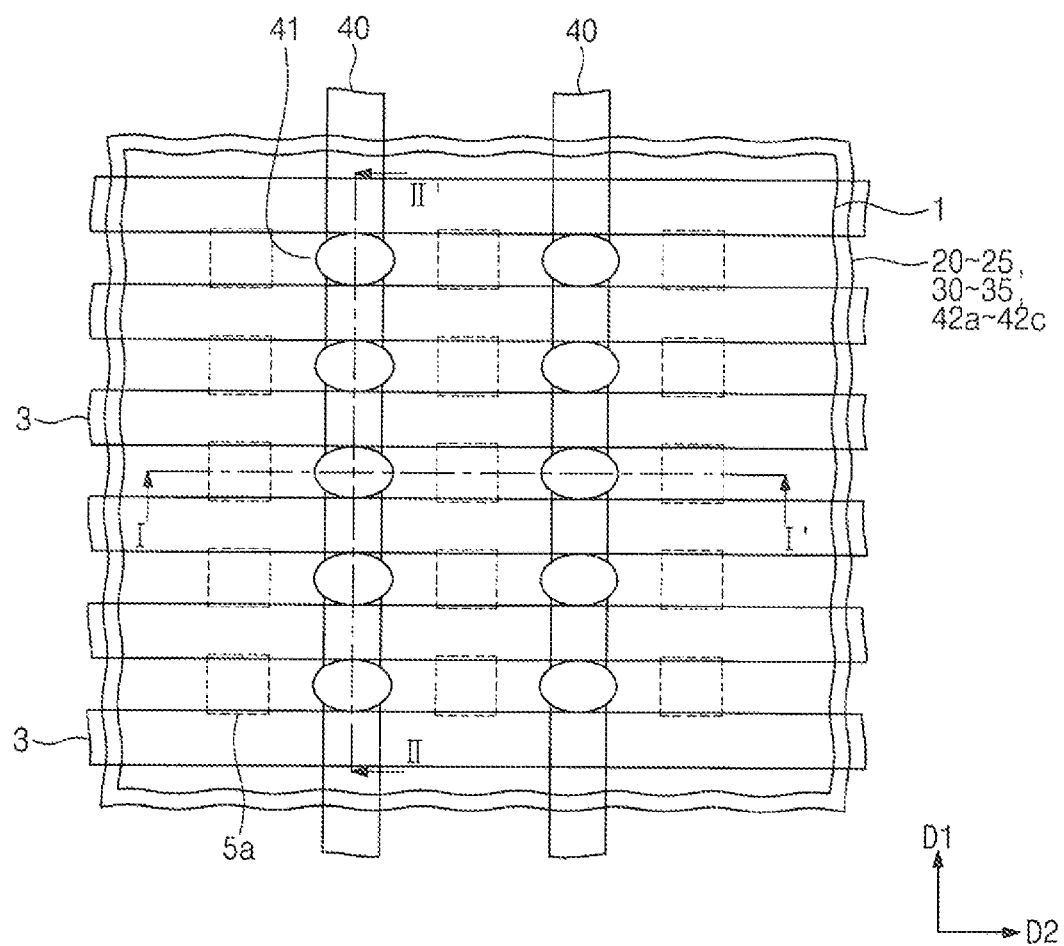
Figure 7C:
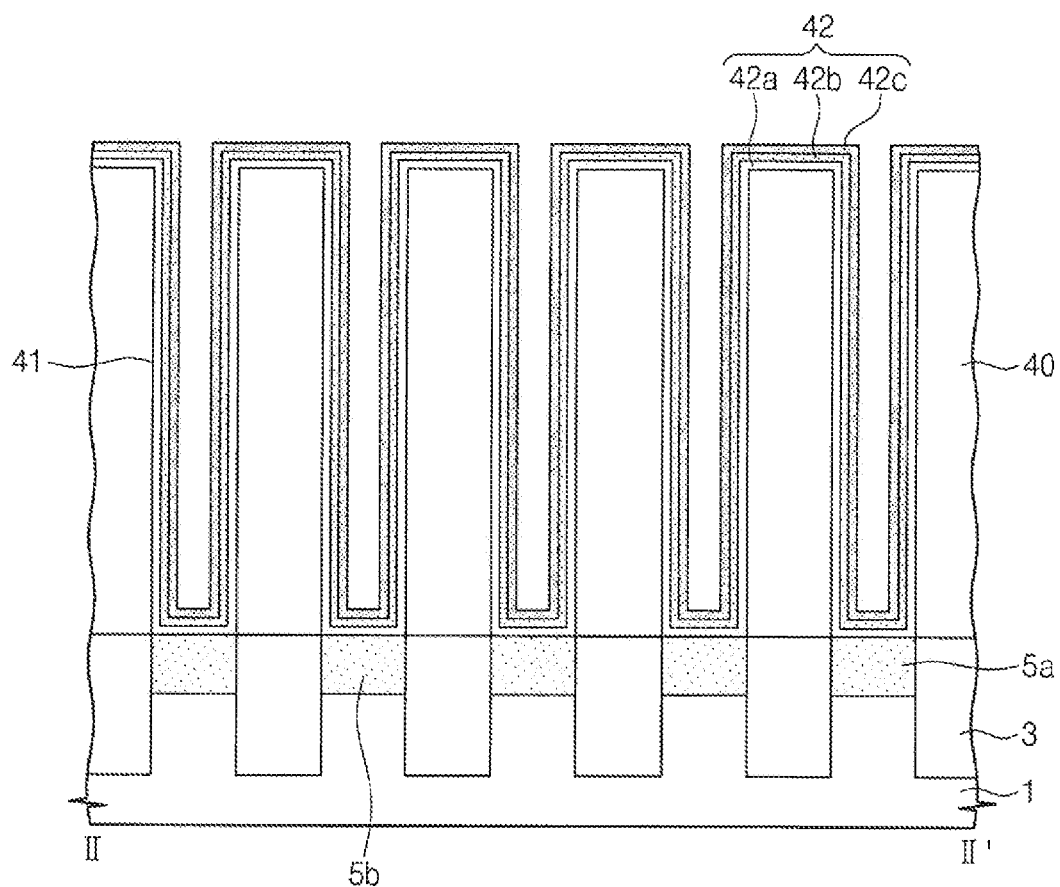

Referring to FIGS. 7A through 7C, the first barrier layer 42a, the oxygen-exchanging layer 42b, and the switching layer 42c may be conformally and sequentially formed on the substrate 1 in which the vertical electrode hole 41 is formed. The first barrier layer 42a, the oxygen-exchanging layer 42b, and the switching layer 42c may be formed by a deposition process, such as atomic layer deposition (ALD) or chemical vapor deposition (CVD), etc. The first barrier layer 42a, the oxygen-exchanging layer 42b and the switching layer 42c may be formed to partially fill the vertical electrode hole 41.

Figure 8A:
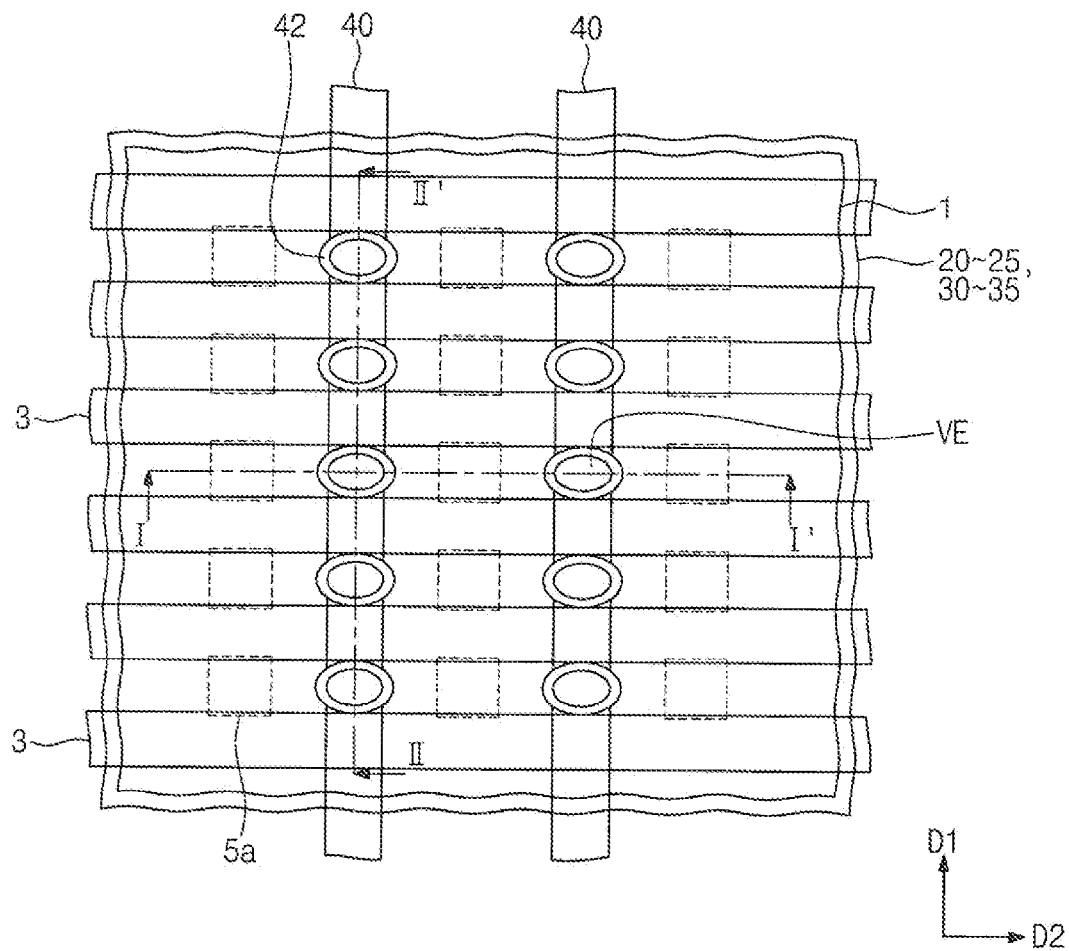
Figure 8B:
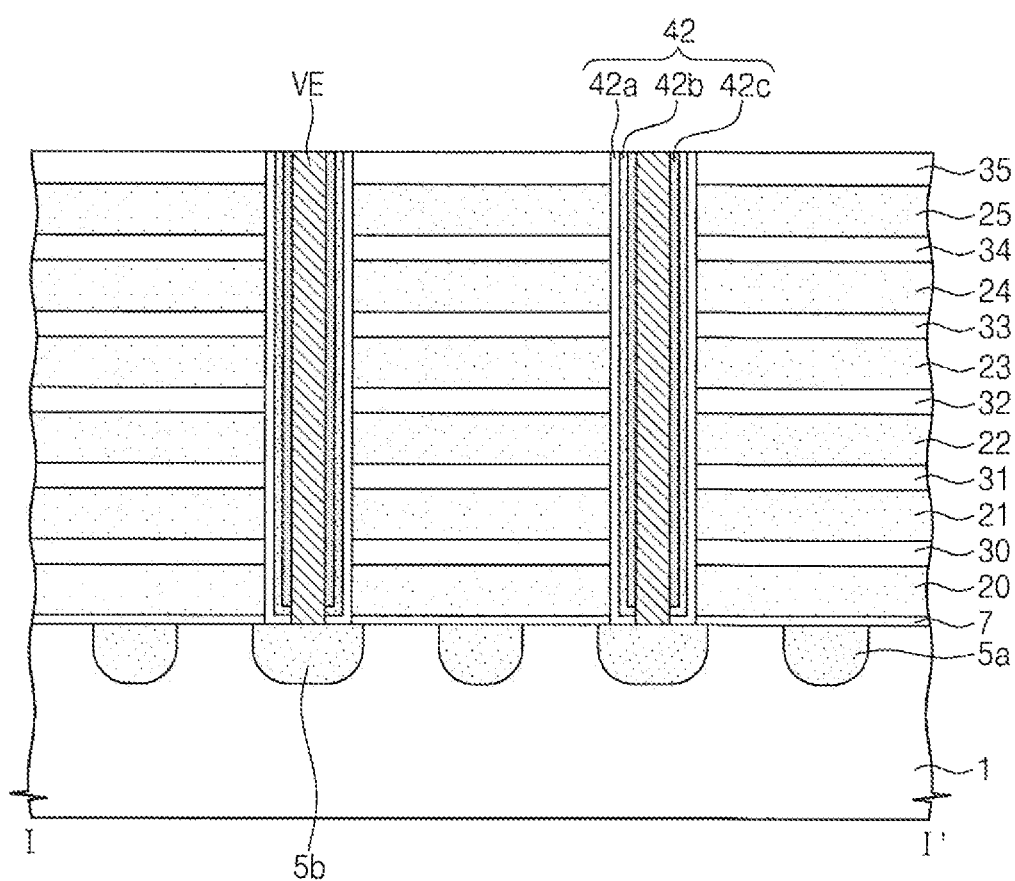
Figure 8C:
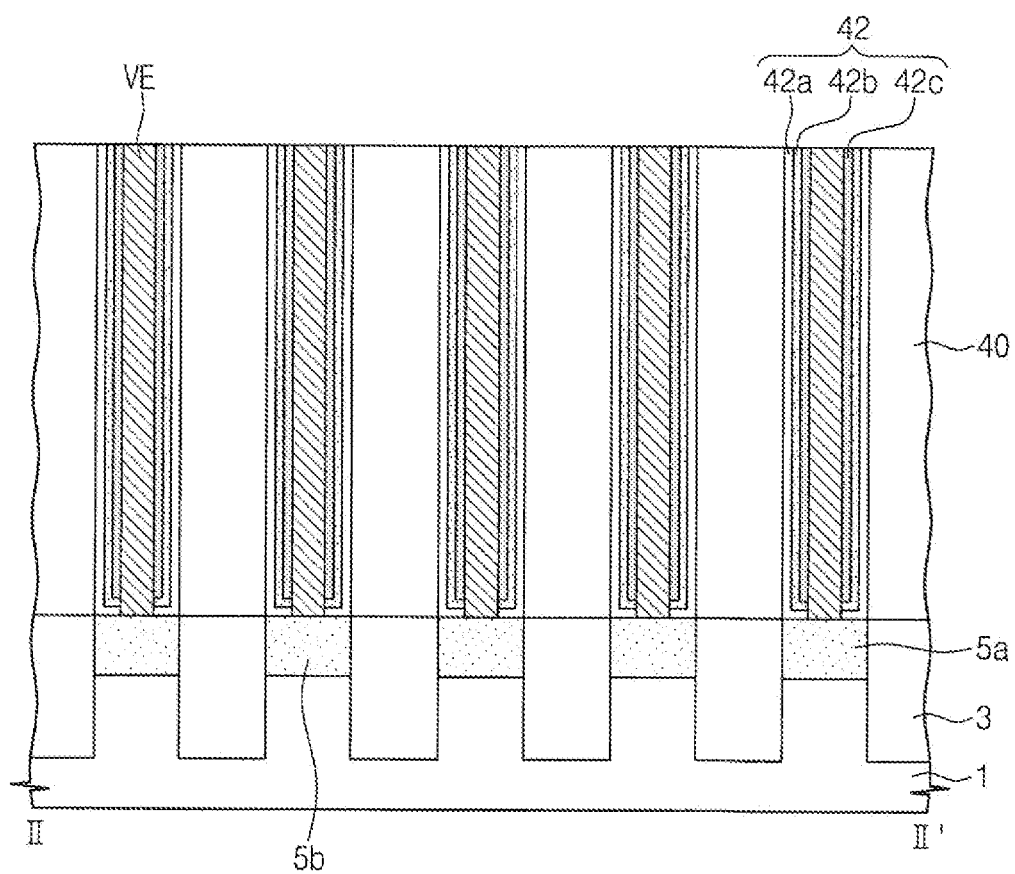

Referring to FIGS. 8A through 8C, the switching layer 42c, the oxygen-exchanging layer 42b, and the first barrier layer 42a may be etched using an anisotropic etching process, and thus, the switching layer 42c, the oxygen-exchanging layer 42b and the first barrier layer 42a may be removed from a top surface of the fifth word line interlayer insulating layer 35 and from a bottom surface of the vertical electrode hole 41 and remain in the form of spacer form on a sidewall of the vertical electrode hole 41. For example, the first barrier layer 42a and the oxygen-exchanging layer 42b may be formed to have an 'L'-shaped section. The switching layer 42c, the oxygen-exchanging layer 42b and the first barrier layer 42a may constitute the variable resistance layer 42. A conductive layer may be formed on the substrate 1 to fill the vertical electrode hole 41, and then be etched by a planarization etching process to form the vertical electrode VE filling the vertical electrode hole 41.

Figure 9A:
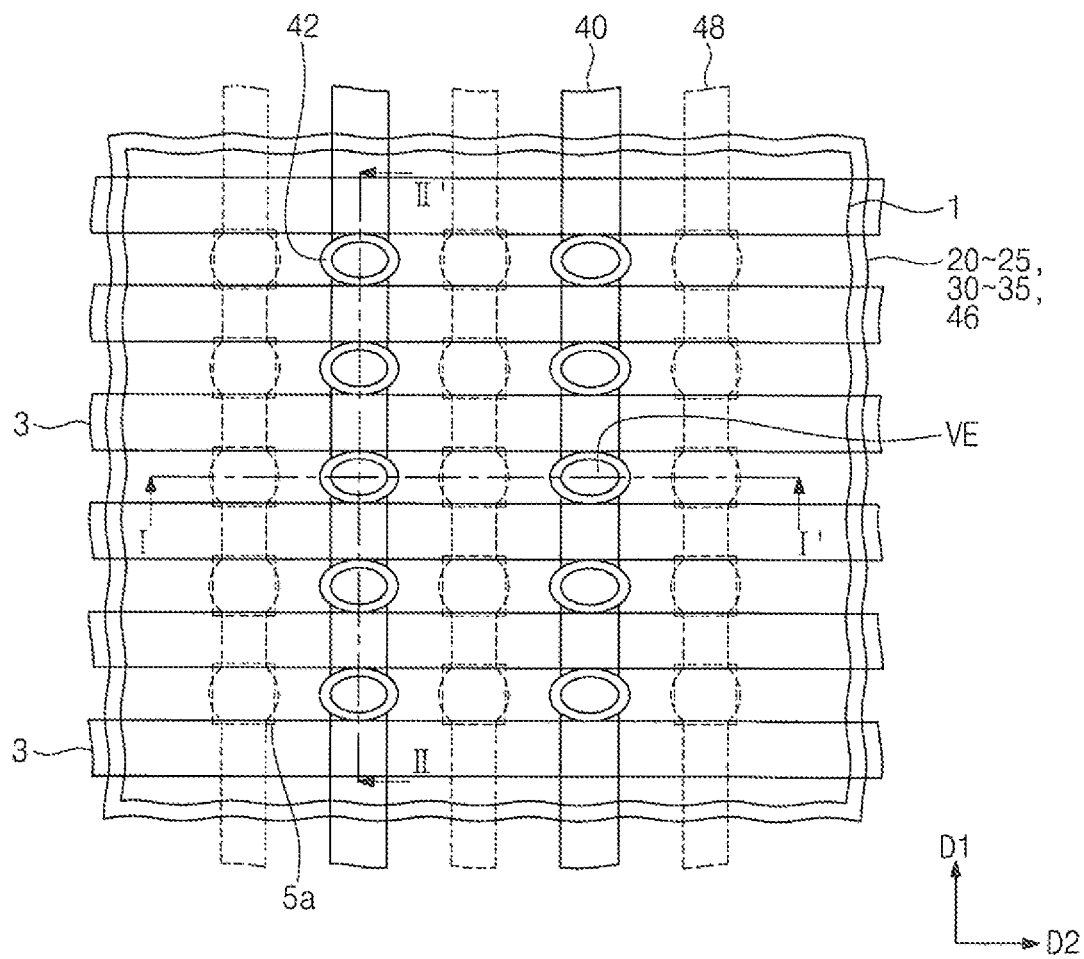
Figure 9B:
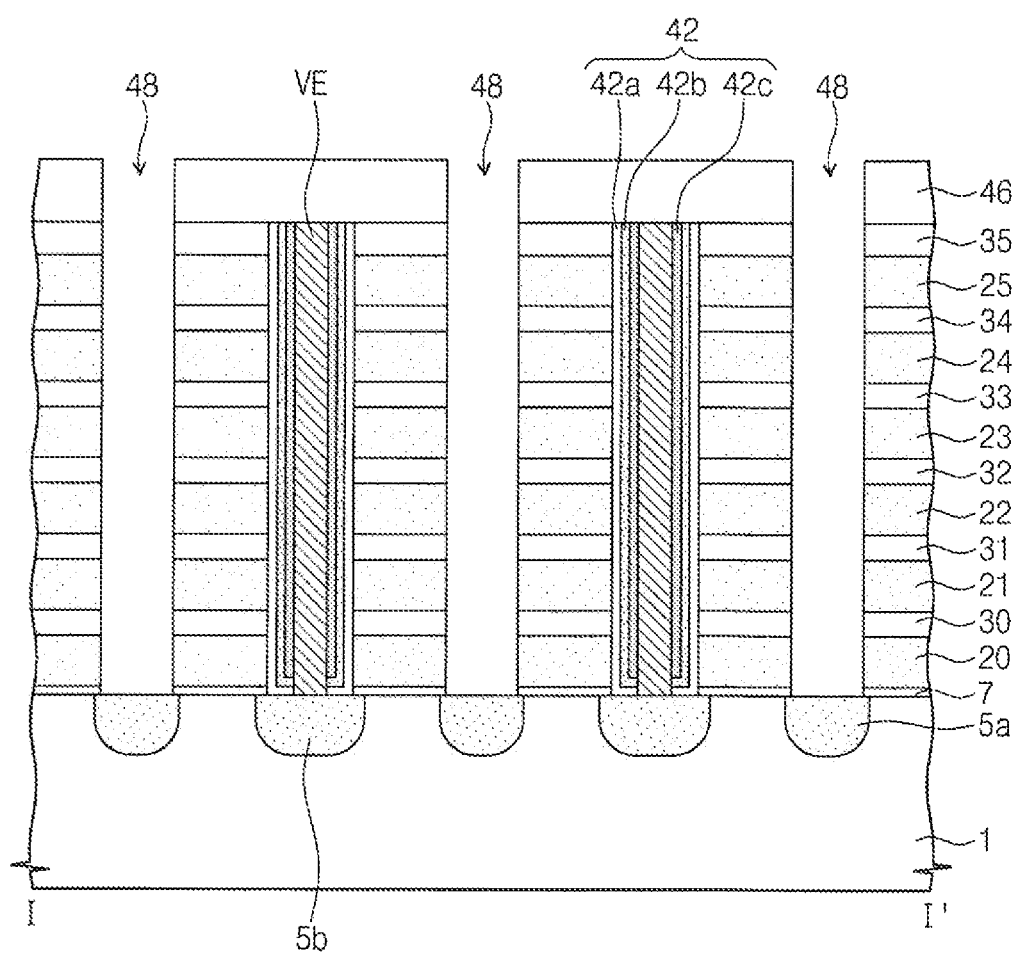
Figure 9C:
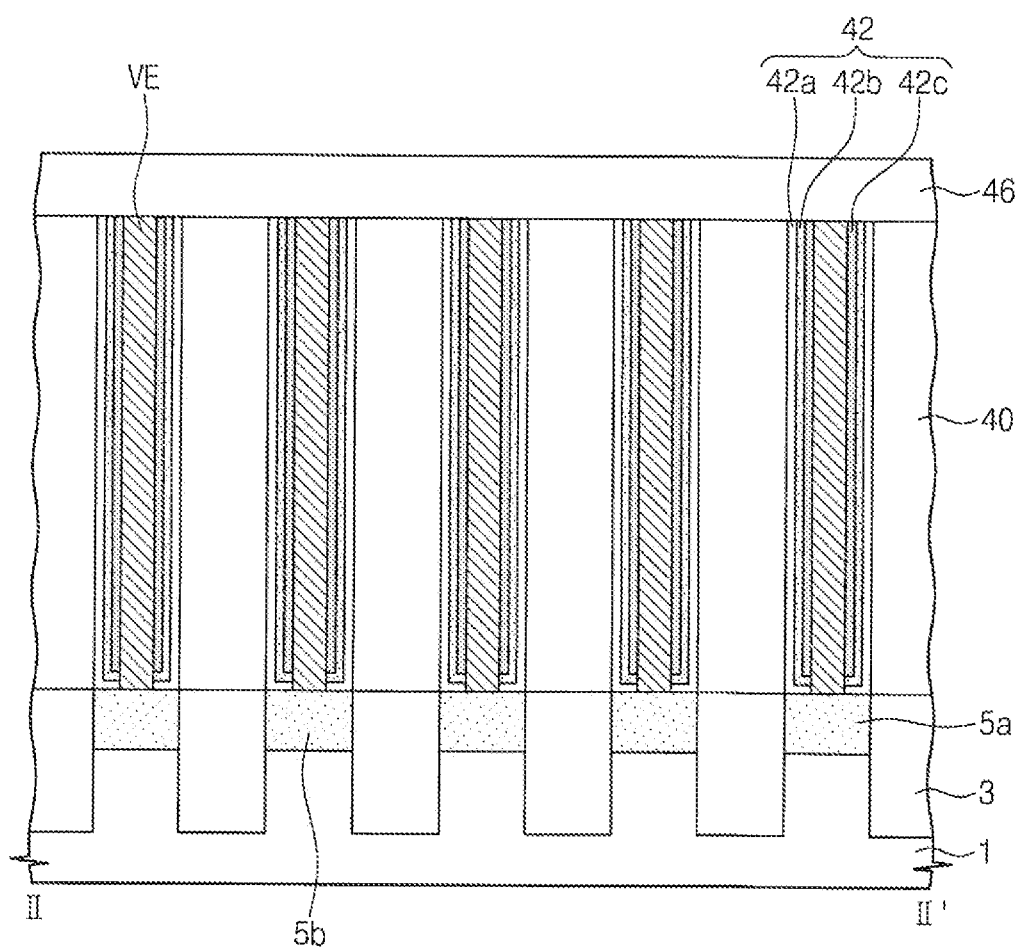

Referring to FIGS. 9A through 9C, a second insulating layer 46 may be formed on the fifth word line interlayer insulating layer 35 to cover top surfaces of the variable resistance layer 42 and the vertical electrode VE. The insulating layers 7, 30-35, and 46 and the sacrificial layers 20-25 may be sequentially etched at positions spaced apart from the variable resistance layer 42 to form a plurality of grooves 48 exposing the first doped region 5a and extending along the first direction D1.

Figure 10A:
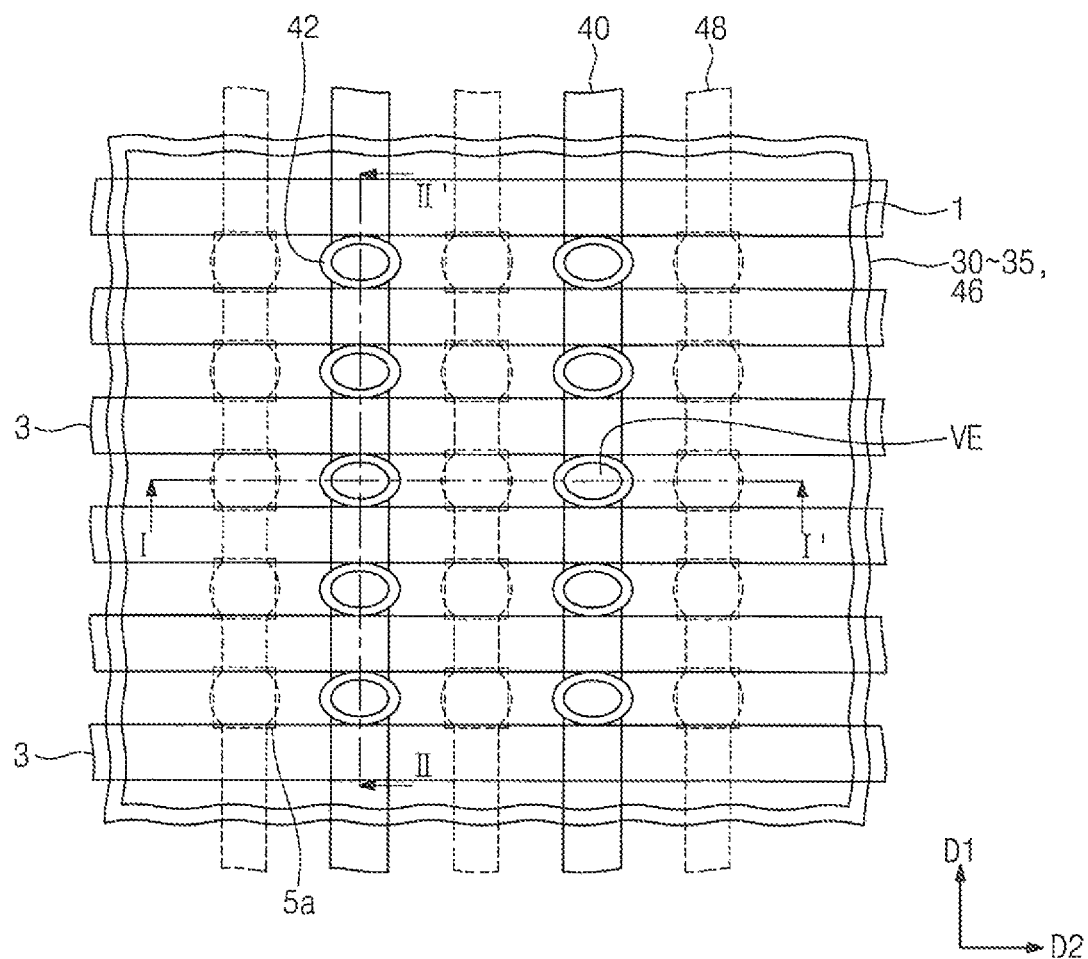
Figure 10B:
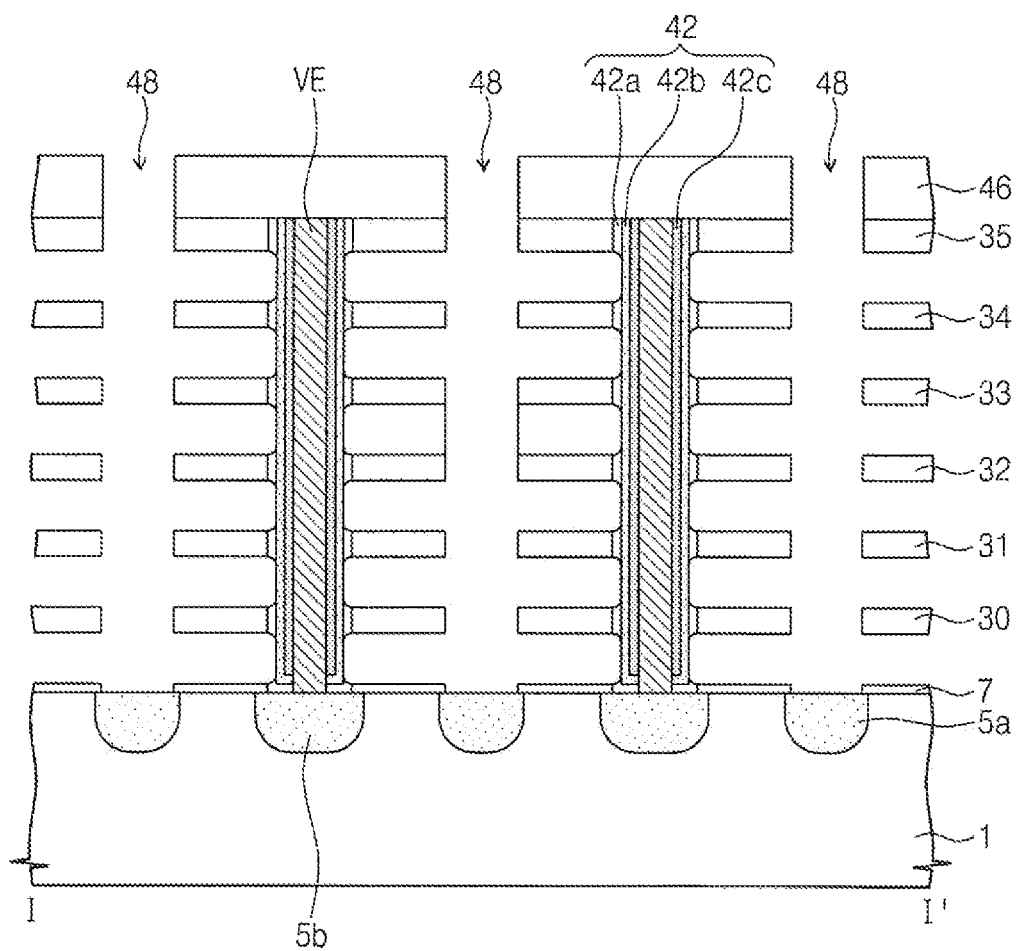
Figure 10C:
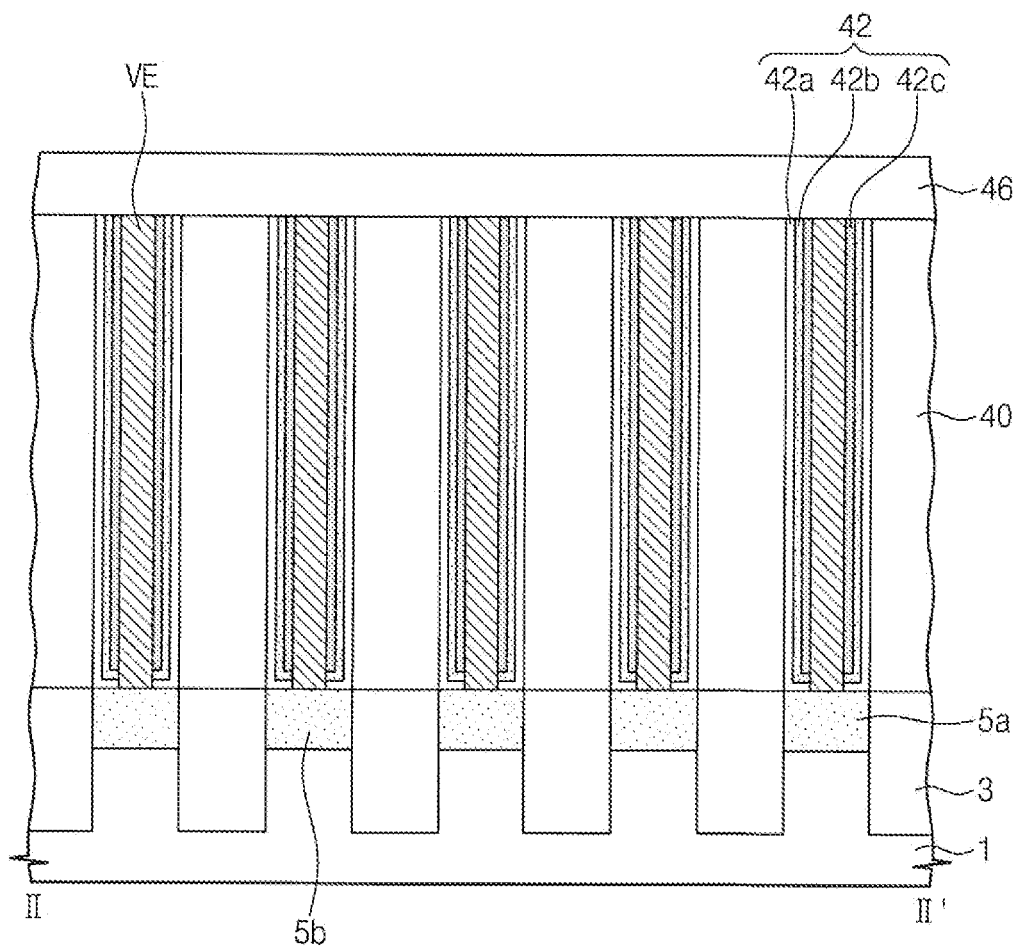

Referring to FIGS. 10A through 10C, an isotropic etching process may be performed to selectively remove the sacrificial layers 20-25 through the grooves 48. The isotropic etching process may be performed using an etchant containing at least one of phosphoric acid, sulfuric acid, and/or hydrochloric acid. Accordingly, top, bottom, and side surfaces of the insulating layers 7, 30-35, and 46 may be exposed. In addition, outer side surfaces of the variable resistance layers 42 may be exposed. Here, the variable resistance layer 42 (for example, the first barrier layer 42a) may be partially removed to expose the oxygen exchange layer 42b.

Meanwhile, if the horizontal electrode layers WLan and WLbn (n=1, 2, . . . , and 5) were to be formed in this state (i.e., directly on the exposed oxygen exchange layer 42b), the horizontal electrode layers WLan and WLbn (n=1, 2, . . . , and 5) and the oxygen exchange layer 42b may be in direct contact with each other. In that case, during operations of the device, oxygen atoms may leak from the oxygen exchange layer 42b, or the oxygen exchange layer 42b may react with the horizontal electrode layer WLan and WLbn (n=1, 2, . . . , and 5), Further, due to the partial removal of the first barrier layer 42a, the device may malfunction. According to some embodiments of the inventive concept, the second barrier layer 42d may be formed to prevent these problems, as described below.

Figure 11A:
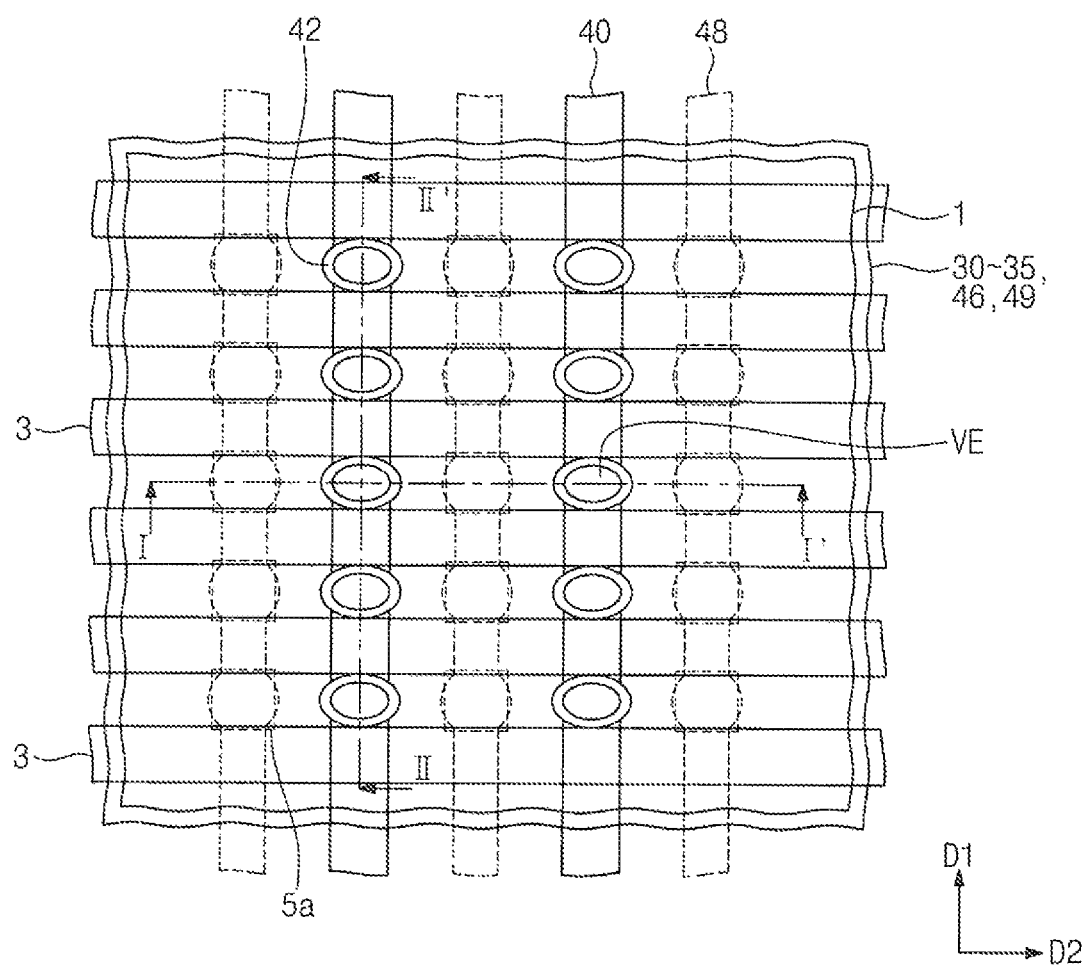
Figure 11B:
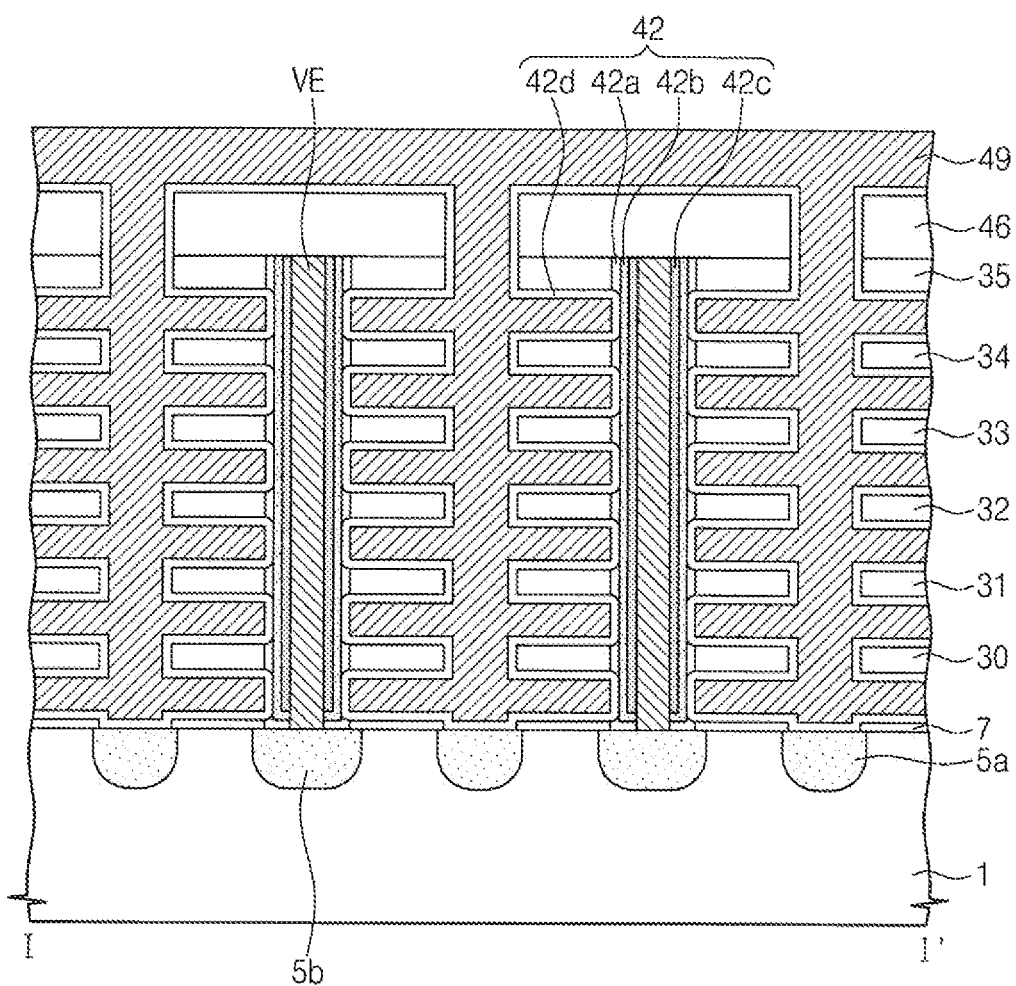
Figure 11C:
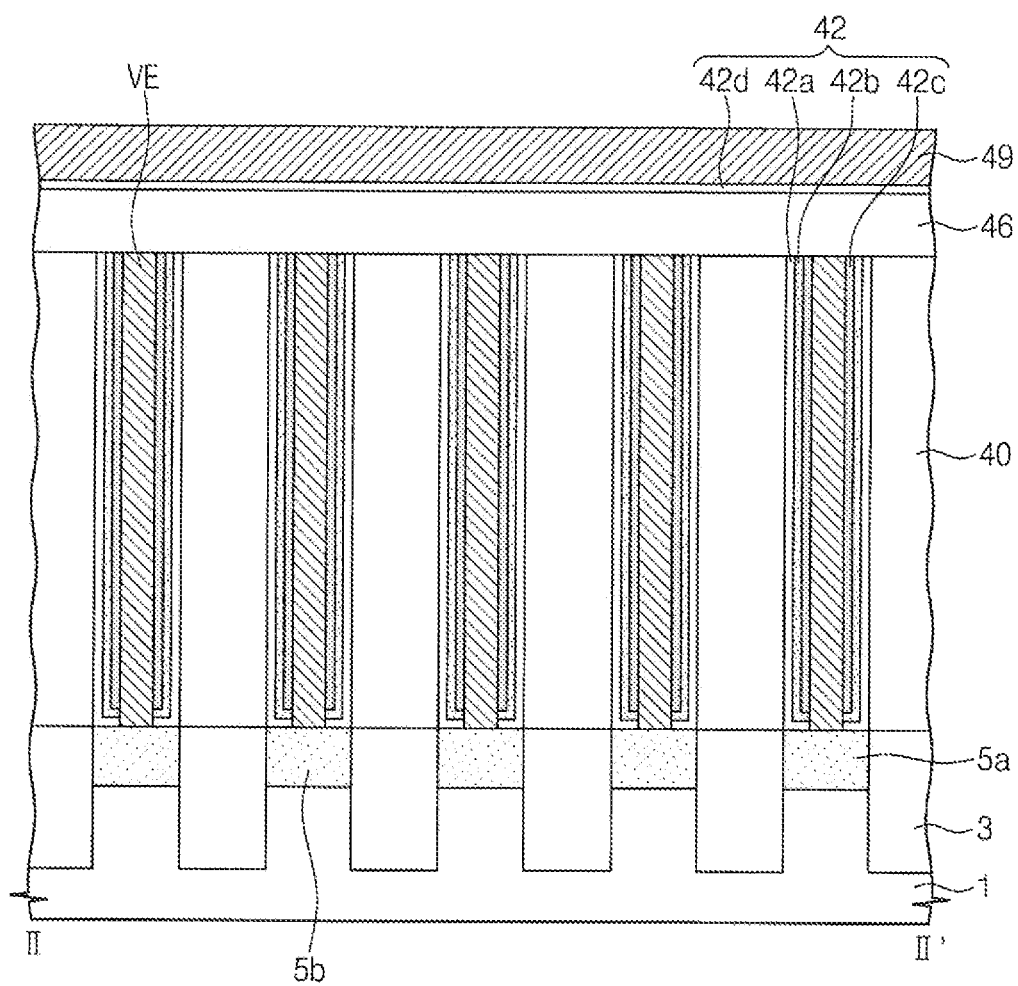

Referring to FIGS. 11A through 11C, the second barrier layer 42d may be conformally formed on the substrate 1. The second barrier layer 42b may be formed to cover conformally the top, bottom, and side surfaces of the insulating layers 7, 30-35, and 46 and the exposed surfaces of the oxygen exchange layer 42b and the substrate 1. A conductive layer 49 may be formed to fill spaces between the grooves 48 and the insulating layers 7, 30-35, and 46. The second barrier layer 42b and the conductive layer 49 may be formed in an in-situ process.

Figure 12A:
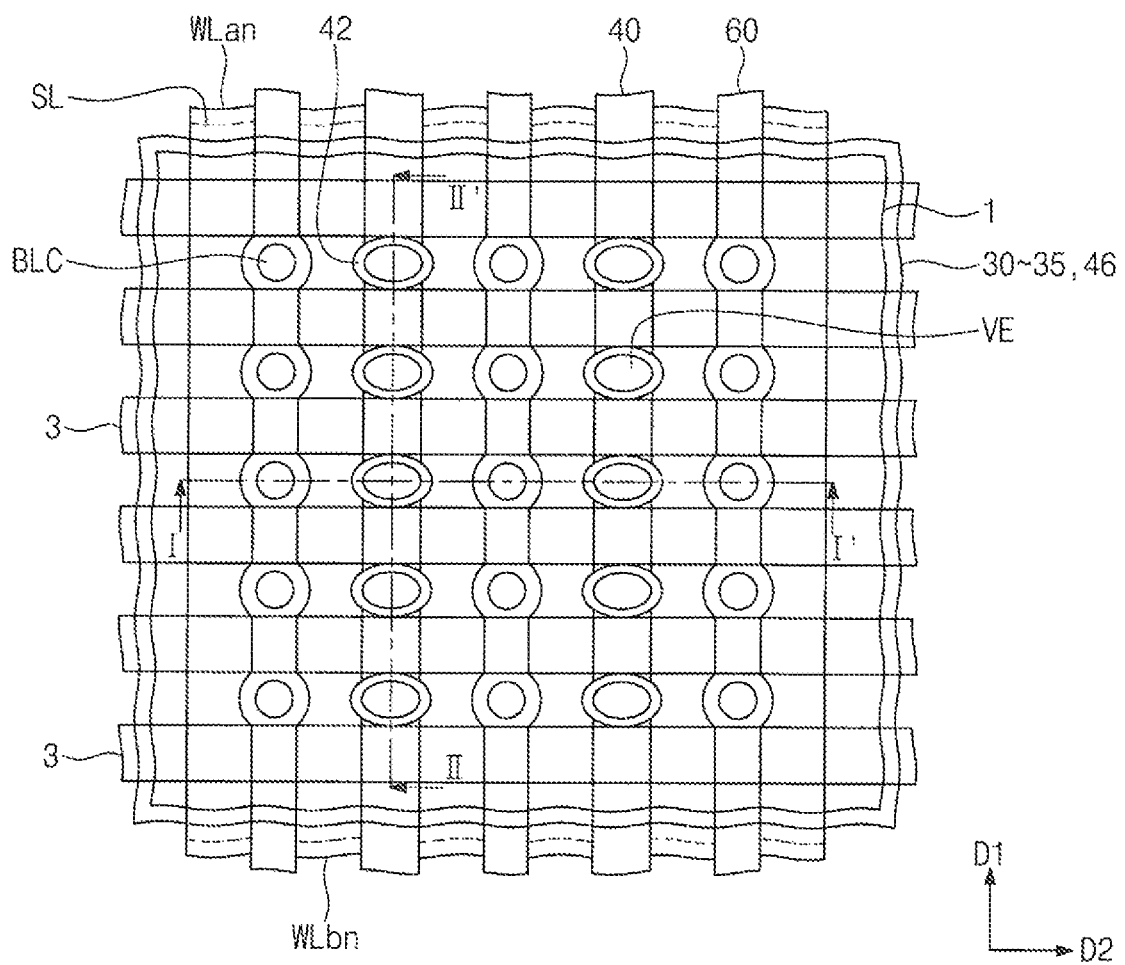
Figure 12B:
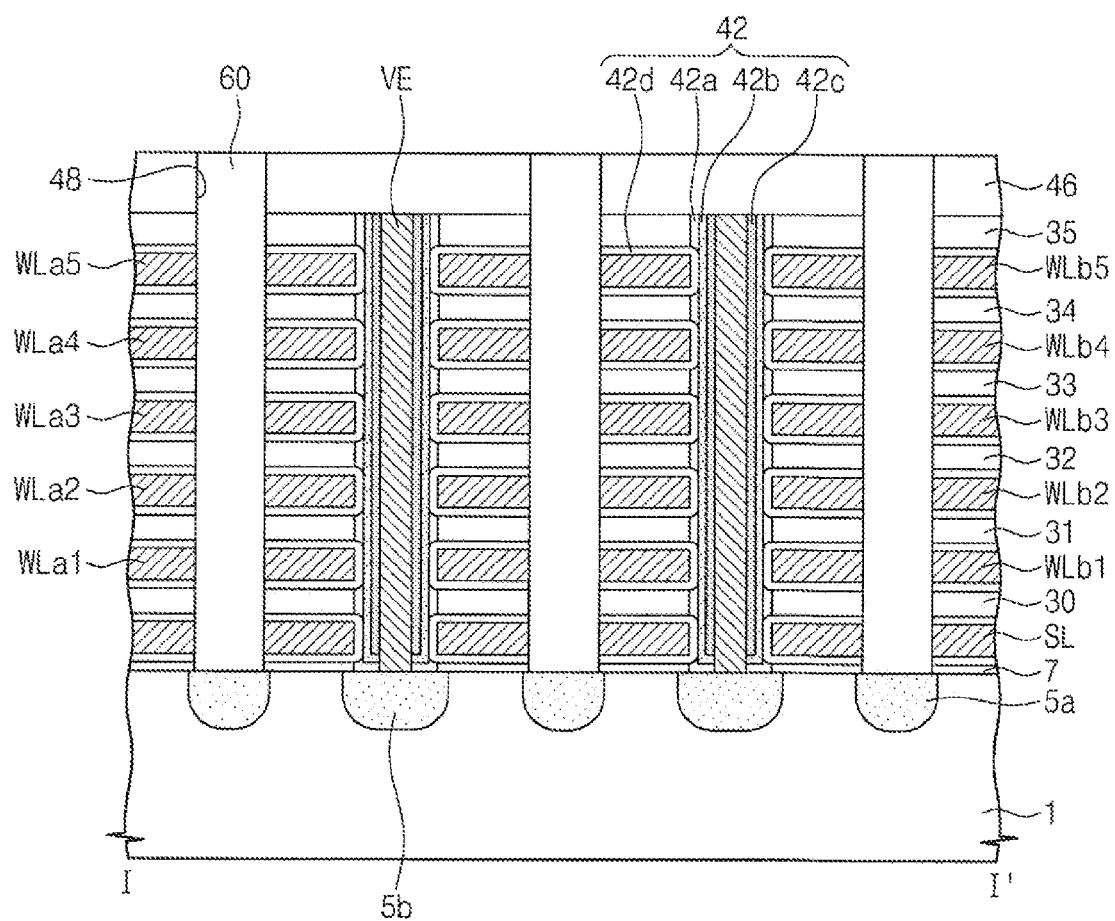
Figure 12C:
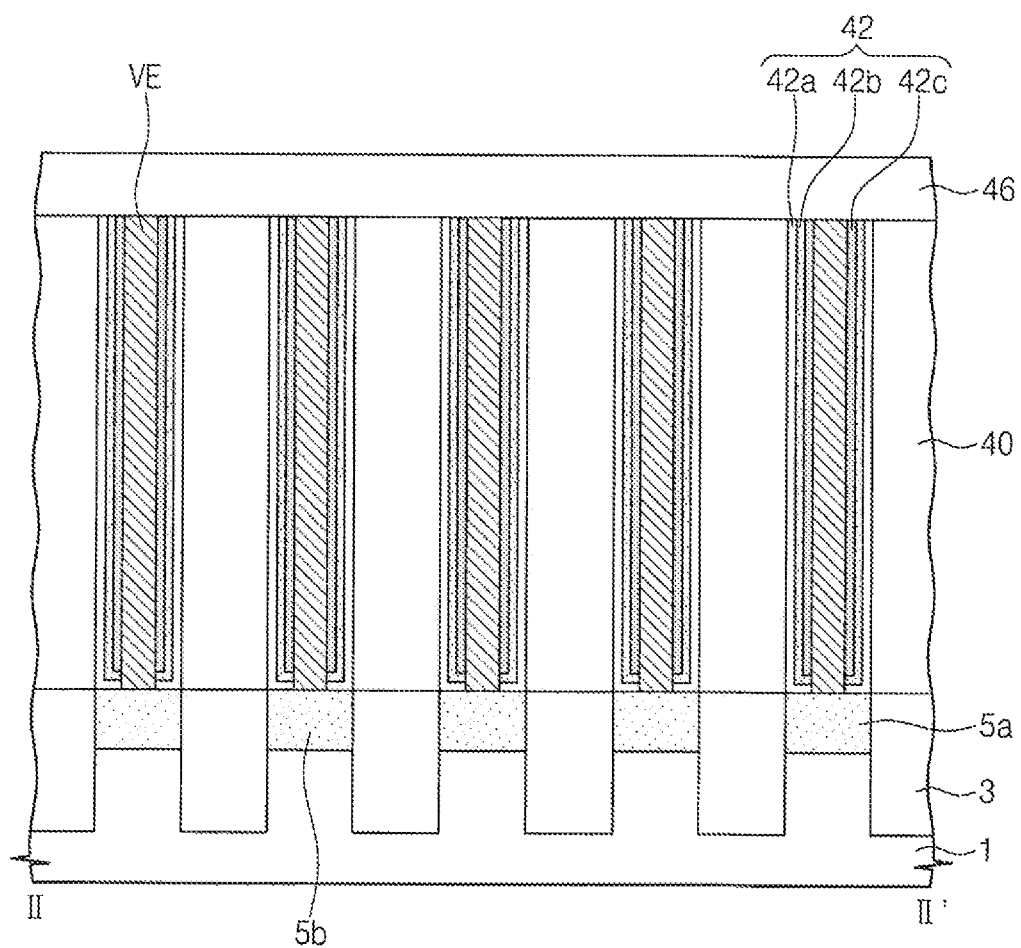

Referring to FIGS. 12A through 12C, a planarization etching process may be performed to remove the conductive layer 49 and the second barrier layer 42b from the second insulating layer 46. Accordingly, a top surface of the second insulating layer 46 may be exposed. Thereafter, the conductive layer 49 may be removed from the groove 48, and then, the second insulating gap-fill layer 60 may be formed in the groove 48. As a result, the formation of the word lines WLan and WLbn may be finished.

Referring back to FIGS. 2A through 2D, the bit line contact BLC may be formed to be in contact with the first doped region 5a in example embodiments, the formation of the bit line contact BLC may include removing at least a portion of the second insulating gap-fill layer 60 and forming a conductive layer therein. Thereafter, a plurality of the bit lines BL, which may be parallel to each other, may be formed on the second insulating layer 46 to be in contact with the bit line contact BLC and extend along the second direction D2.

According to some embodiments of the inventive concept, methods of fabricating a variable resistance memory device may include forming the second barrier layer 42d before the formation of the horizontal electrode layers WLan and WLbn (n=1, 2, . . . , and 5). In the final structure, the second barrier layer 42d may be used as a portion of the variable resistance layer 42, and thus, it may make it possible to avoid damage in the variable resistance layer 42 that may otherwise occur when the sacrificial layers 20-25 are removed. In other words, it may be possible to reduce/prevent the variable resistance layer 42 from being deteriorated. Further, since the variable resistance layer 42 includes the relatively thin barrier layer 42d provided between the insulating layers 30-35, it may be possible to keep the total thickness of the variable resistance memory device small.

So Ear, methods for realizing the variable resistance memory device of FIGS. 2B and 2D have been described, but devices with the variable resistance layer 42 of FIG. 2E or FIG. 2F can be easily realized using the methods described above or its modification by the skilled person in this art.

Figure 13:
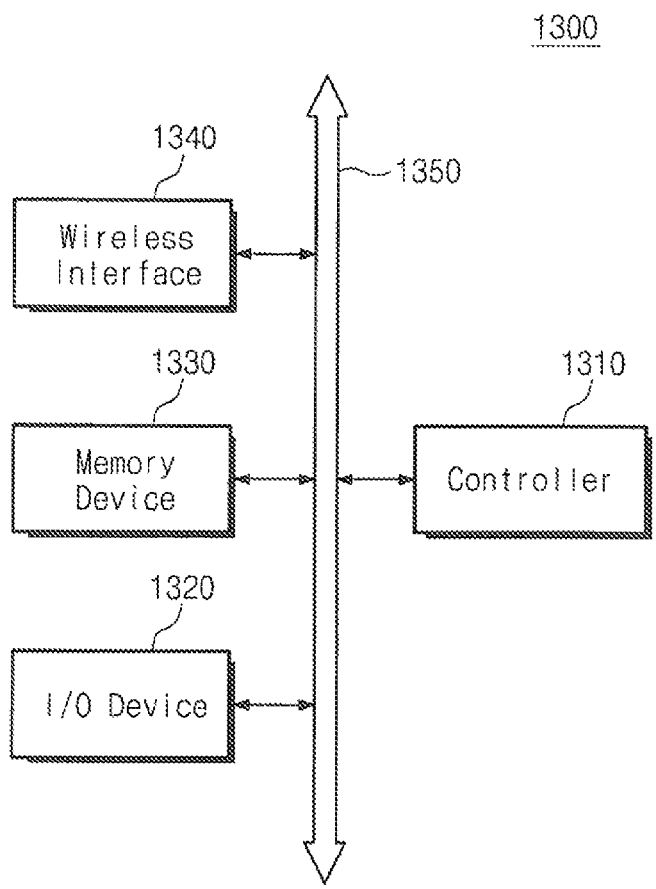
FIGS. 13 and 14 are block diagrams schematically illustrating electronic devices including a semiconductor device according to example embodiments of inventive concept.
Figure 14:
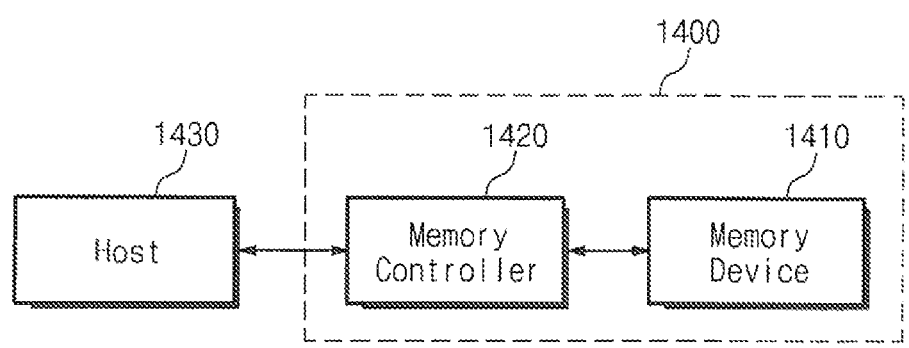

FIGS. 13 and 14 are block diagrams schematically illustrating electronic devices including a semiconductor device according to some embodiments of the inventive concept.

Referring to FIG. 13, an electronic device 1300 including a semiconductor device according to example embodiments of inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 14, a memory system including a semiconductor device according to example embodiments of inventive concept will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concept.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PIMP) technique, a die in waffle pack technique, a die in wafer form technique, a chip on board (COB) technique, a ceramic dual in-line package (CERDIP) technique, a plastic quad flat package (POPP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to some embodiments of the inventive concept, methods of fabricating a variable resistance memory device may include forming an additional barrier layer before forming a horizontal electrode layer. In the final structure, the additional barrier layer may be used as a portion of the variable resistance layer, and thus, it may help to avoid damage in the variable resistance layer that may occur when a sacrificial layer is removed. In other words, it may be possible to reduce/prevent the variable resistance layer from being deteriorated. Further, the variable resistance layer may include a relatively thin barrier layer provided between word line interlayer insulating layers, which may enable the total thickness of the variable resistance memory device to be reduced.

While example embodiments of the inventive concept have been particularly shown and described, it will be understood by one of ordinary skill in the art that variations in form and detail may be made therein without departing from the spirit and scope of the attached claims.

What is claimed is:
1. A method of fabricating a variable resistance memory device, comprising:
alternatingly stacking a plurality of sacrificial layers and a plurality of insulating layers on a layer;
patterning the insulating layers and the sacrificial layers to form a vertical electrode hole;
forming a first barrier layer on a sidewall of the vertical electrode hole;
forming a switching layer on a sidewall of the first barrier layer;
forming a vertical electrode in the vertical electrode hole, the vertical electrode being connected to the layer;
patterning the insulating layers and the sacrificial layers to form a groove spaced apart from the vertical electrode hole;
removing the sacrificial layers through the groove to form an empty space;
conformally forming a second barrier layer in the empty space; and
filling the empty space with a horizontal electrode layer.

2. The method of claim 1, wherein the first barrier layer is partially removed during the removing of the sacrificial layers through the groove.

3. The method of claim 1, wherein the forming of the second barrier layer and the horizontal electrode layer is performed in an in-situ manner.

* * * * *